(12) United States Patent
Nomiya et al.

(10) Patent No.: US 12,476,590 B2
(45) Date of Patent: Nov. 18, 2025

(54) OSCILLATOR

(71) Applicant: SEIKO EPSON CORPORATION, Tokyo (JP)

(72) Inventors: Takashi Nomiya, Matsumoto (JP); Kentaro Seo, Shiojiri (JP)

(73) Assignee: SEIKO EPSON CORPORATION (JP)

( * ) Notice: Subject to any disclaimer, the term of this patent is extended or adjusted under 35 U.S.C. 154(b) by 0 days.

(21) Appl. No.: 18/645,569

(22) Filed: Apr. 25, 2024

(65) Prior Publication Data

US 2024/0364261 A1 Oct. 31, 2024

(30) Foreign Application Priority Data

Apr. 27, 2023 (JP) ................ 2023-073119

(51) Int. Cl.
*H03B 5/04* (2006.01)
*H03B 5/32* (2006.01)
*H03L 1/02* (2006.01)
*H03L 1/04* (2006.01)

(52) U.S. Cl.
CPC ............. *H03B 5/04* (2013.01); *H03B 5/32* (2013.01); *H03L 1/028* (2013.01); *H03L 1/04* (2013.01)

(58) Field of Classification Search
CPC .... H03B 5/04; H03B 5/32; H03B 5/36; H03L 1/04; H03L 1/028
See application file for complete search history.

(56) References Cited

U.S. PATENT DOCUMENTS

| | | | |
|---|---|---|---|
| 11,165,388 B2* | 11/2021 | Kamiya | ............... H03B 5/32 |
| 2007/0229176 A1* | 10/2007 | Fukuda | ............... H03B 5/368 |
| | | | 331/158 |
| 2020/0313677 A1* | 10/2020 | Seo | ............... H03L 1/025 |

FOREIGN PATENT DOCUMENTS

JP 2016-105572 A 6/2016

* cited by examiner

*Primary Examiner* — Ryan Johnson
(74) *Attorney, Agent, or Firm* — Harness, Dickey & Pierce, P.L.C.

(57) ABSTRACT

An oscillator includes a resonator element, a first temperature sensor that measures a temperature of the resonator element, a temperature control element that controls the temperature of the resonator element, and a temperature control circuit that generates a control signal for controlling an operation of the temperature control element, in which the temperature control circuit generates the control signal based on a value obtained by multiplying a difference between a set temperature and a first measured temperature measured by the first temperature sensor by a gain, and the gain is variable.

7 Claims, 13 Drawing Sheets

FIG. 17

| | | AMOUNT OF CHANGE IN TEMPERATURE CONTROL CODE DOVC | | |
| --- | --- | --- | --- | --- |
| | | SMALL | MEDIUM | LARGE |
| AMOUNT OF CHANGE IN TEMPERATURE CODE DTS1 | SMALL | TEMPERATURE COMPENSATION COEFFICIENT 3 | TEMPERATURE COMPENSATION COEFFICIENT 2 | TEMPERATURE COMPENSATION COEFFICIENT 1 |
| | MEDIUM | TEMPERATURE COMPENSATION COEFFICIENT 1 | TEMPERATURE COMPENSATION COEFFICIENT 3 | TEMPERATURE COMPENSATION COEFFICIENT 2 |
| | LARGE | TEMPERATURE COMPENSATION COEFFICIENT 2 | TEMPERATURE COMPENSATION COEFFICIENT 1 | TEMPERATURE COMPENSATION COEFFICIENT 3 |

FIG. 18

| CUMULATIVE VALUE OF TEMPERATURE CODE DTS1 | | |
| --- | --- | --- |
| SMALL | MEDIUM | LARGE |
| ADDITIONAL TEMPERATURE COMPENSATION COEFFICIENT 1 | ADDITIONAL TEMPERATURE COMPENSATION COEFFICIENT 2 | ADDITIONAL TEMPERATURE COMPENSATION COEFFICIENT 3 |

OSCILLATOR

The present application is based on, and claims priority from JP Application Serial Number 2023-073119, filed Apr. 27, 2023, the disclosure of which is hereby incorporated by reference herein in its entirety.

BACKGROUND

1. Technical Field

The present disclosure relates to an oscillator.

2. Related Art

JP-A-2016-105572 discloses a constant temperature bath type quartz crystal oscillator that detects a heat amount leaking to the outside from a package configuring a constant temperature bath in which a quartz crystal oscillator is accommodated to correct an oscillation frequency of the quartz crystal oscillator based on the detected leaked heat amount.

A resonator element included in the quartz crystal oscillator has temperature characteristics. Thus, in order to set the oscillation frequency of the quartz crystal oscillator to a desired oscillation frequency, there is a need to stabilize a temperature of the resonator element at a predetermined temperature. However, in the constant temperature bath type quartz crystal oscillator described in JP-A-2016-105572, since a gain for controlling a temperature of the constant temperature bath is fixed, the gain is not appropriate depending on the application or operation environment of the oscillator. Thus, the temperature of the resonator element may not be appropriately controlled.

SUMMARY

According to an aspect of the present disclosure, there is provided an oscillator including
a resonator element,
a first temperature sensor that measures a temperature of the resonator element,
a temperature control element that controls the temperature of the resonator element, and
a temperature control circuit that generates a control signal for controlling an operation of the temperature control element, in which
the temperature control circuit generates the control signal based on a value obtained by multiplying a difference between a set temperature and a first measured temperature measured by the first temperature sensor by a gain, and
the gain is variable.

BRIEF DESCRIPTION OF THE DRAWINGS

FIG. 17 is a diagram showing an example of a first table.
FIG. 18 is a diagram showing an example of a second table.

DESCRIPTION OF EMBODIMENTS

Hereinafter, appropriate embodiments of the present disclosure will be described in detail with reference to the drawings. In addition, the embodiments which will be described below do not inappropriately limit the contents of the present disclosure described in the claims. In addition, not all of the configurations which will be described below are necessarily essential components of the present disclosure.

1. First Embodiment

1-1. Structure of Oscillator

Figure 1:
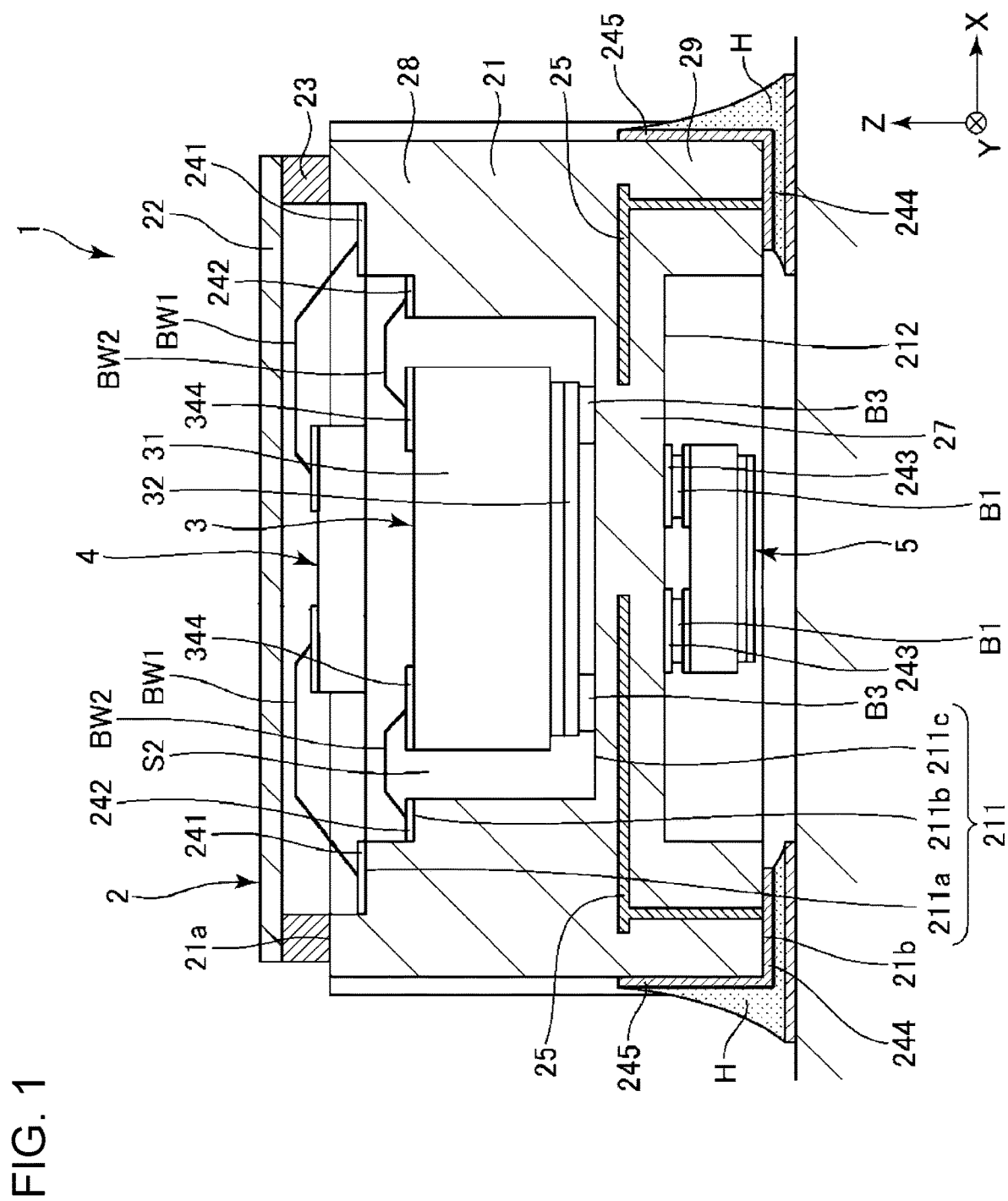
FIG. 1 is a cross-sectional view of an oscillator according to the present embodiment.
Figure 2:
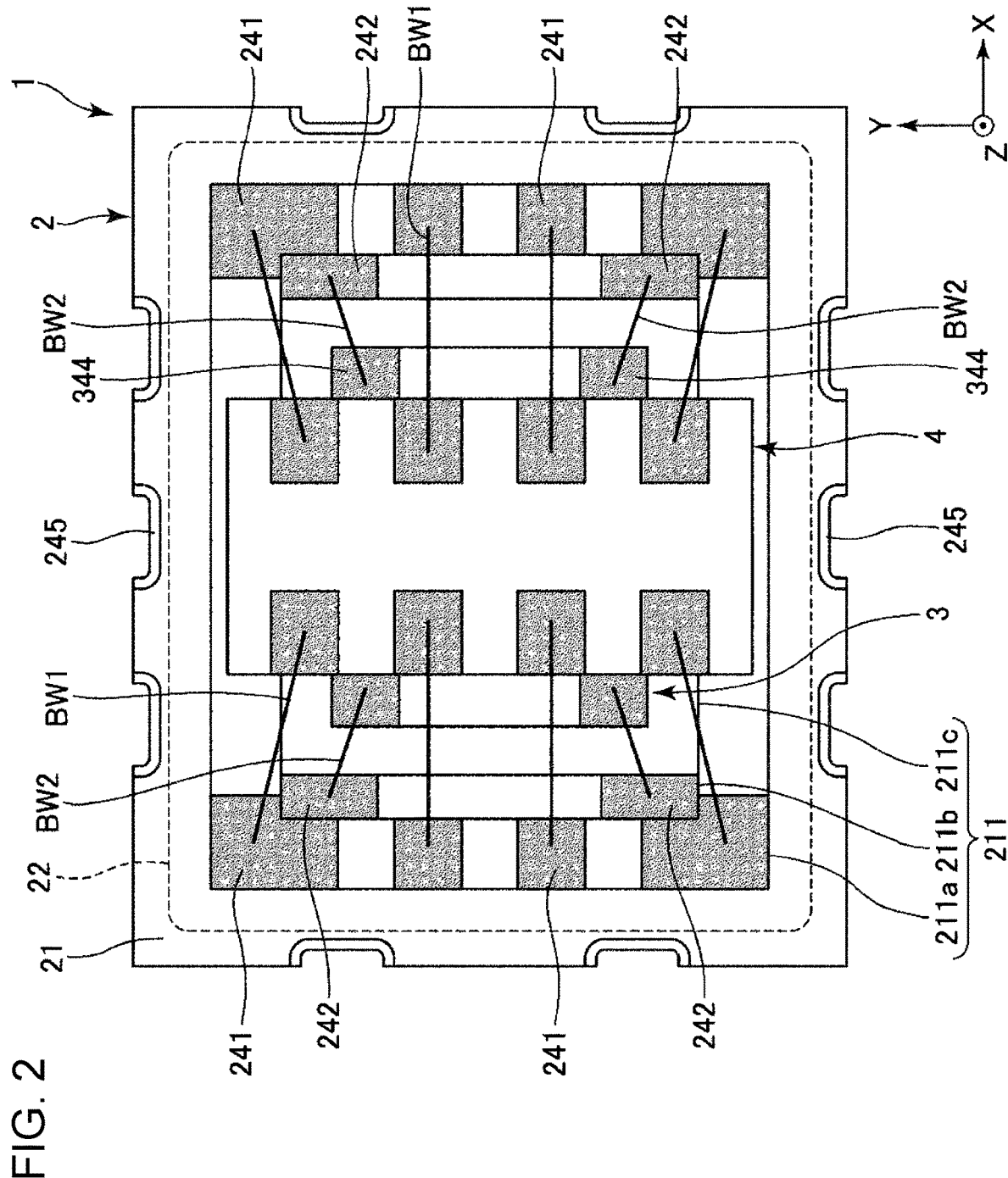
FIG. 2 is a plan view of the oscillator according to the present embodiment.
Figure 3:
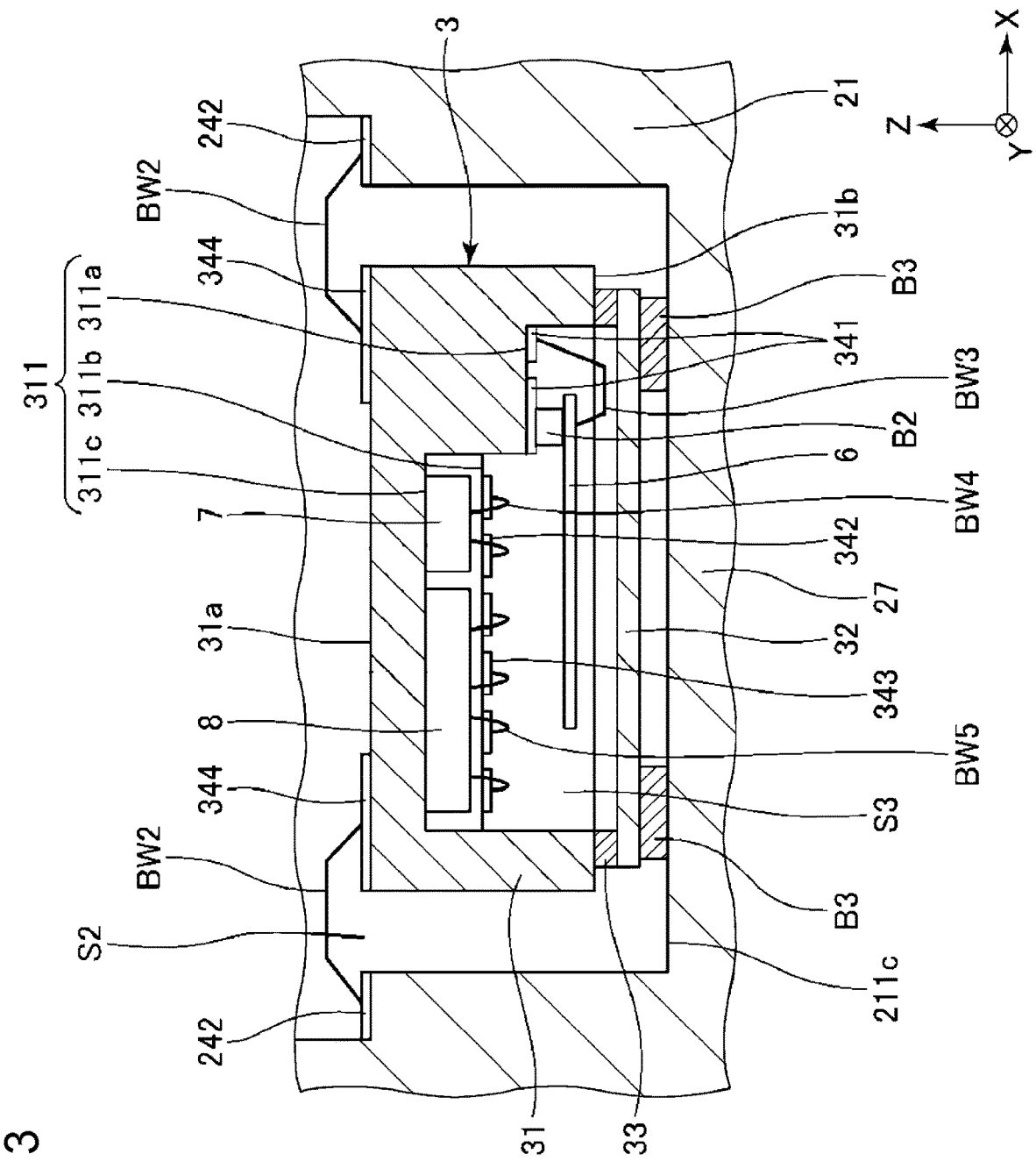
FIG. 3 is a cross-sectional view of an inner-side package included in the oscillator and an inside of the inner-side package.
Figure 4:
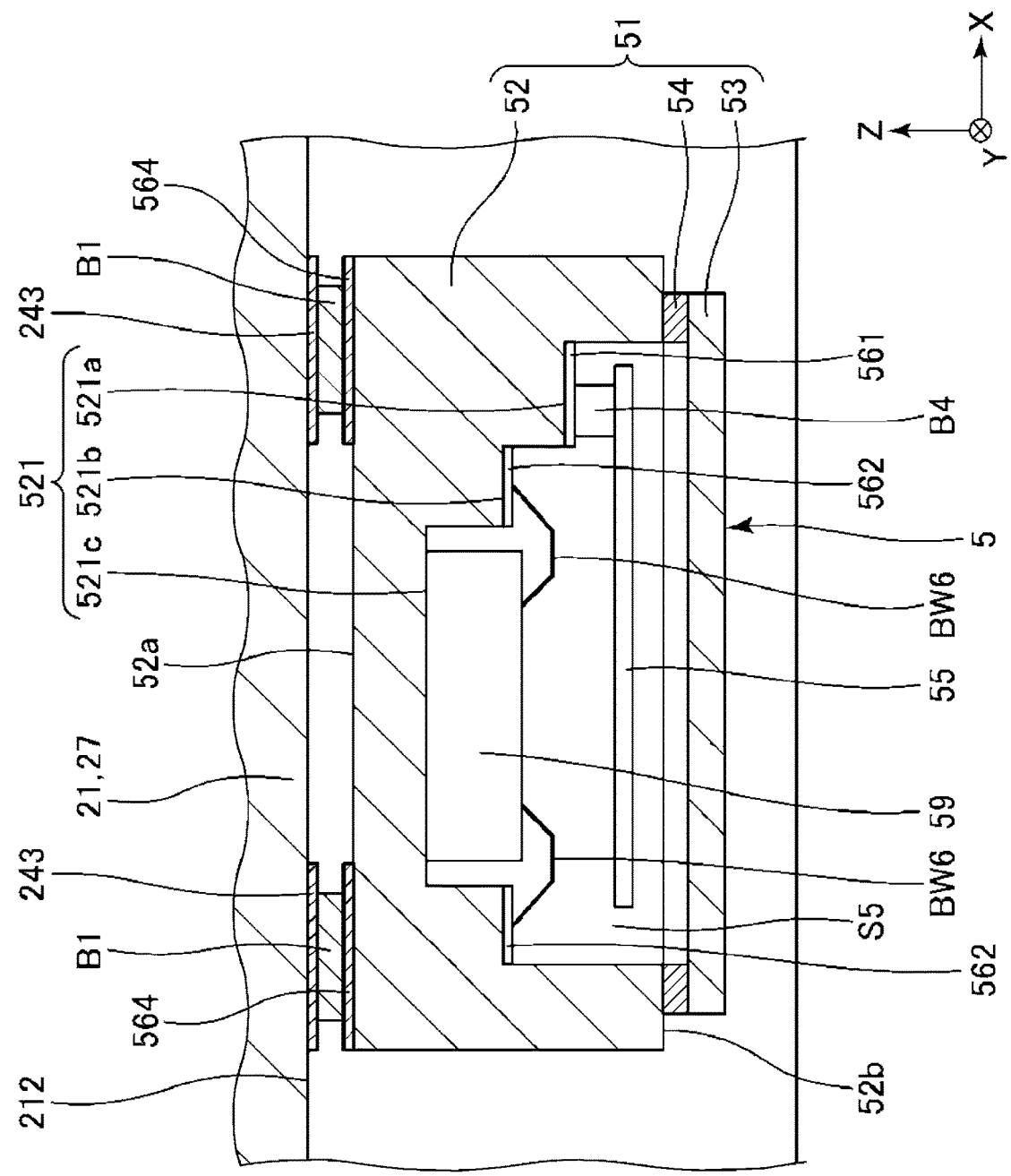
FIG. 4 is a cross-sectional view of a voltage controlled oscillator included in the oscillator.

FIG. 1 is a cross-sectional view of an oscillator according to the present embodiment. FIG. 2 is a plan view in which an oscillator is viewed from an upper surface side. FIG. 3 is a cross-sectional view of an inner-side package included in the oscillator and an inside of the inner-side package. FIG. 4 is a cross-sectional view of a voltage controlled oscillator included in the oscillator.

An oscillator 1 shown in FIGS. 1 and 2 is a constant temperature bath type quartz crystal oscillator, and includes an outer-side package 2, an inner-side package 3, a control IC 4, and a voltage controlled oscillator 5. The inner-side package 3, the control IC 4, and the voltage controlled oscillator 5 are accommodated in the outer-side package 2.

As shown in FIG. 1, the outer-side package 2 has an outer-side base 21 and an outer-side lid 22. The outer-side base 21 has a substrate 27, a frame-shaped wall portion 28 erected upward from an edge portion of an upper surface of the substrate 27, and a frame-shaped leg portion 29 erected downward from an edge portion of a lower surface of the substrate 27. The upper surface of the substrate 27 and the wall portion 28 form an upper-side recess portion 211 that opens to an upper surface 21a of the outer-side base 21, and the lower surface of the substrate 27 and the leg portion 29 form a lower-side recess portion 212 that opens to a lower surface 21b of the outer-side base 21. Therefore, the outer-side base 21 has a substantial H type in a cross-sectional view.

The upper-side recess portion 211 has a first upper-side recess portion 211a that opens to the upper surface 21a, a second upper-side recess portion 211b that opens to a bottom surface of the first upper-side recess portion 211a and has a smaller opening than that of the first upper-side recess portion 211a, and a third upper-side recess portion 211c that opens to a bottom surface of the second upper-side recess portion 211b and has a smaller opening than that of the second upper-side recess portion 211b. A control IC 4 is disposed on the bottom surface of the first upper-side recess portion 211a, and the inner-side package 3 is disposed on a bottom surface of the third upper-side recess portion 211c.

The outer-side lid 22 is bonded to the upper surface 21a of the outer-side base 21 via a sealing member 23, such as a seal ring or low melting point glass, in a manner to close an opening of the upper-side recess portion 211. Accordingly, the upper-side recess portion 211 is airtightly sealed, and an outer-side accommodation space S2 as an accommodation space is formed in the outer-side package 2. On the other hand, an opening of the lower-side recess portion 212 is not sealed and faces an outside of the outer-side package 2. The inner-side package 3 and the control IC 4 are accommodated in the outer-side accommodation space S2, and the voltage controlled oscillator 5 is disposed in the lower-side recess portion 212.

The outer-side base 21 is disposed with a plurality of internal terminals 241 disposed on the bottom surface of the first upper-side recess portion 211a, a plurality of internal terminals 242 disposed on the bottom surface of the second upper-side recess portion 211b, a plurality of internal terminals 243 disposed on the bottom surface of a bottom surface of the lower-side recess portion 212, and a plurality of external terminals 244 disposed on the lower surface 21b, that is, a top surface of the leg portion 29. Each internal terminal 241 is electrically coupled to the control IC 4 via a bonding wire BW1, each internal terminal 242 is electrically coupled to the inner-side package 3 via a bonding wire BW2, and each internal terminal 243 is electrically coupled to the voltage controlled oscillator 5 via a conductive bonding member B1.

Each of these terminals 241, 242, 243, and 244 is electrically coupled as appropriate via an internal wiring 25 formed in the outer-side base 21 to electrically couple the control IC 4, the inner-side package 3, the voltage controlled oscillator 5, and the external terminal 244. The internal wiring 25 is coupled to the external terminal 244 through the inside of the leg portion 29. The external terminal 244 is coupled to an external device (not illustrated). A side surface terminal 245 coupled to the external terminal 244 is disposed on a side surface of the leg portion 29. The side surface terminal 245 is a castellation. Therefore, a solder H wets and spreads on the side surface terminal 245 to form a fillet, which makes mechanical and electrical coupling to the external device stronger. However, the present disclosure is not limited thereto, and for example, the side surface terminal 245 may be omitted.

As shown in FIG. 3, the inner-side package 3 has an inner-side base 31 and an inner-side lid 32. The inner-side base 31 has a recess portion 311 that opens to a lower surface 31b.

The recess portion 311 has a first recess portion 311a that opens to the lower surface 31b, a second recess portion 311b that opens to a bottom surface of the first recess portion 311a and has a smaller opening than that of the first recess portion 311a, and a third recess portion 311c that opens to a bottom surface of the second recess portion 311b and has a smaller opening than that of the second recess portion 311b. A resonator element 6 is disposed on the bottom surface of the first recess portion 311a, and a heat generation IC 7 and an oscillation IC 8 are disposed side by side in an X-axis direction on a bottom surface of the third recess portion 311c.

The inner-side lid 32 is bonded to the lower surface 31b of the inner-side base 31 via a sealing member 33, such as a seal ring or low melting point glass, in a manner to close an opening of the recess portion 311. Accordingly, the recess portion 311 is airtightly sealed, and an inner-side accommodation space S3 is formed in the inner-side package 3. The resonator element 6, the heat generation IC 7, and the oscillation IC 8 are accommodated in the inner-side accommodation space S3.

Such an inner-side accommodation space S3 is airtight, and is in a decompressed state, preferably in a state closer to a vacuum. Accordingly, viscous resistance of the inner-side accommodation space S3 is reduced, and vibration characteristics of the resonator element 6 are improved. However, an atmosphere of the inner-side accommodation space S3 is not particularly limited.

The inner-side base 31 is disposed with a plurality of internal terminals 341 disposed on the bottom surface of the first recess portion 311a, a plurality of internal terminals 342 and 343 disposed on the bottom surface of the second recess portion 311b, and a plurality of external terminals 344 disposed on an upper surface 31a of the inner-side base 31. Each internal terminal 341 is electrically coupled to the resonator element 6 via a conductive bonding member B2 and a bonding wire BW3, each internal terminal 342 is electrically coupled to the heat generation IC 7 via a bonding wire BW4, and each internal terminal 343 is electrically coupled to the oscillation IC 8 via a bonding wire BW5.

Each of these terminals 341, 342, 343, and 344 is electrically coupled as appropriate via an internal wiring (not illustrated) formed in the inner-side package 3 to electrically couple the resonator element 6, the heat generation IC 7, the oscillation IC 8, and the external terminal 344. In such an inner-side package 3, the inside and the outside of the inner-side package 3 are electrically coupled to each other via the external terminal 344.

The inner-side package 3 as described above is fixed to the bottom surface of the third upper-side recess portion 211c in the inner-side lid 32 via a bonding member B3 having a sufficiently low thermal conductivity.

As shown in FIG. 3, the heat generation IC 7 is disposed on the bottom surface of the third recess portion 311c with an active surface facing downward (inner-side lid 32 side), and is electrically coupled to the plurality of internal terminals 342 via the bonding wire BW4. The oscillation IC 8 is disposed on the bottom surface of the third recess portion 311c with an active surface facing downward (inner-side lid 32 side), and is electrically coupled to the plurality of internal terminals 343 via the bonding wire BW5.

The voltage controlled oscillator 5 is an oscillator that outputs an oscillation signal whose frequency changes according to an input voltage. As shown in FIG. 4, the voltage controlled oscillator 5 has a package 51, and a resonator element 55 and an oscillation IC 59 accommodated in the package 51.

The package 51 has a base 52 and a lid 53. The base 52 has a recess portion 521 that opens to a lower surface 52b. The recess portion 521 has a first recess portion 521a that opens to the lower surface 52b, a second recess portion 521b that opens to a bottom surface of the first recess portion 521a and has a smaller opening than that of the first recess portion 521a, and a third recess portion 521c that opens to a bottom surface of the second recess portion 521b and has a smaller opening than that of the second recess portion 521b. The resonator element 55 is disposed on the bottom surface of the first recess portion 521a, and the oscillation IC 59 is disposed on a bottom surface of the third recess portion 521c.

The lid 53 is bonded to the lower surface 52b of the base 52 via a sealing member 54, such as a seal ring or low melting point glass, in a manner to close an opening of the recess portion 521. Accordingly, the recess portion 521 is airtightly sealed, and an accommodation space S5 is formed in the package 51. The resonator element 55 and the oscillation IC 59 are accommodated in the accommodation space S5. The accommodation space S5 is airtight, and is in a decompressed state, preferably in a state closer to a vacuum. Accordingly, the viscous resistance of the accommodation space S5 is reduced, and the vibration characteristics of the resonator element 55 are improved. However, an atmosphere of the accommodation space S5 is not particularly limited.

The base 52 is disposed with a plurality of internal terminals 561 disposed on the bottom surface of the first recess portion 521a, a plurality of internal terminals 562 disposed on the bottom surface of the second recess portion 521b, and a plurality of external terminals 564 disposed on an upper surface 52a of the base 52. Each internal terminal 561 is electrically coupled to the resonator element 55 via a conductive bonding member B4, and each internal terminal 562 is electrically coupled to the oscillation IC 59 via a bonding wire BW6. Each of these terminals 561, 562, and 564 is electrically coupled as appropriate via an internal wiring (not illustrated) formed in the base 52 to electrically couple the resonator element 55, the oscillation IC 59, and the external terminal 564. In such a package 51, the inside and the outside of the package 51 are electrically coupled to each other via the external terminal 564.

The resonator element 55 is an AT cut quartz crystal resonator element. However, the resonator element 55 may not have to be the AT cut quartz crystal resonator element, and may be, for example, an SC cut quartz crystal resonator element, a BT cut quartz crystal resonator element, a tuning fork type quartz crystal resonator element, a surface acoustic wave resonator, another piezoelectric resonator element, or a MEMS resonance element.

The oscillation IC 59 is disposed on the bottom surface of the third recess portion 521c with an active surface facing downward, and is electrically coupled to the plurality of internal terminals 562 via the bonding wire BW6.

As shown in FIG. 4, the voltage controlled oscillator 5 is fixed to the bottom surface of the lower-side recess portion 212 via the conductive bonding member B1. Further, the external terminal 564 and the internal terminal 243 are electrically coupled to each other via the bonding member B1.

1-2. Functional Configuration of Oscillator

Figure 5:
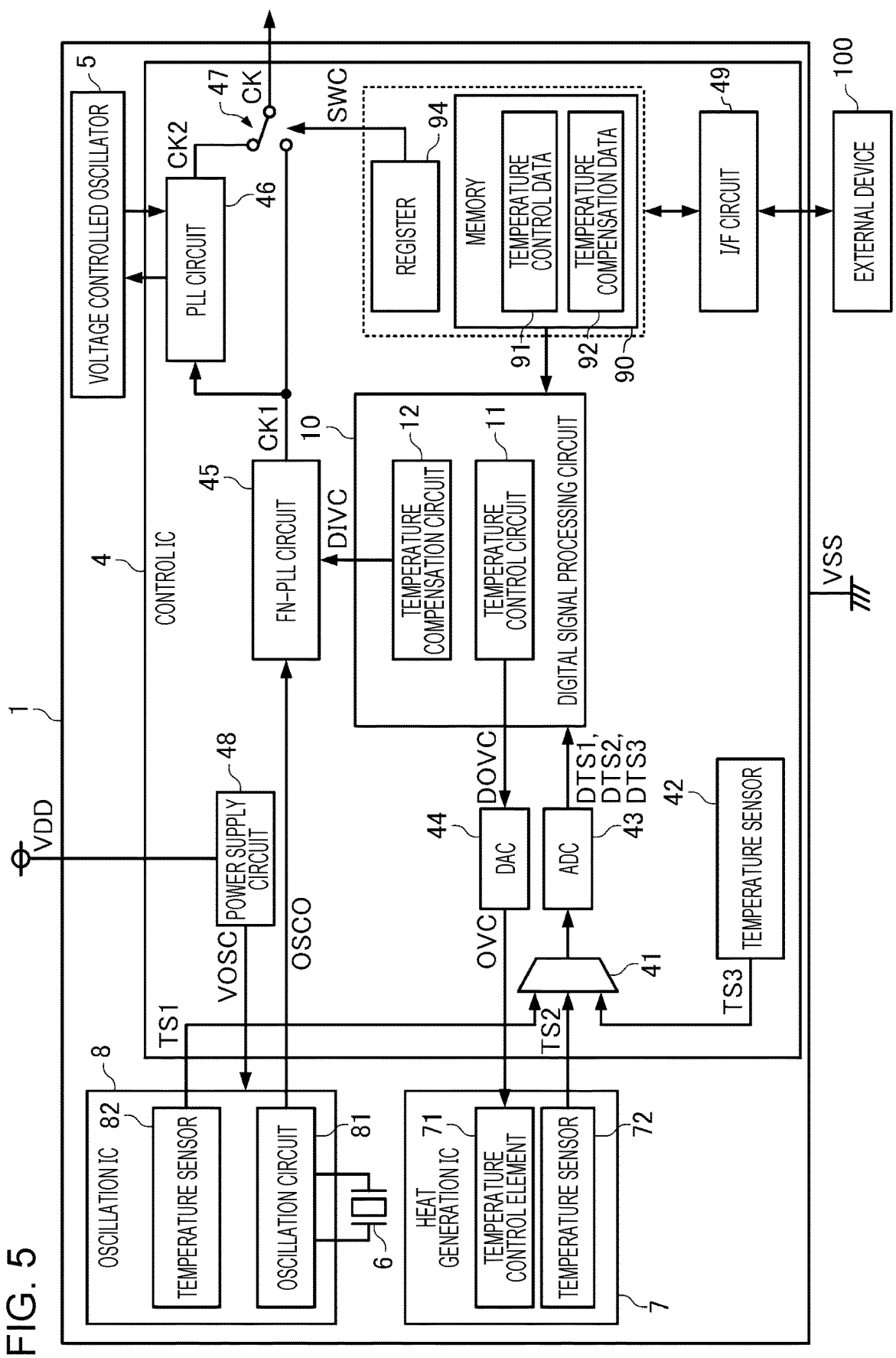
FIG. 5 is a functional block diagram of the oscillator.

FIG. 5 is a functional block diagram of the oscillator 1 according to the present embodiment. In FIG. 5, the same reference numerals are assigned to the same components as those shown in FIGS. 1 to 4. As shown in FIG. 5, the oscillator 1 according to the present embodiment includes the control IC 4, the voltage controlled oscillator 5, the resonator element 6, the heat generation IC 7, and the oscillation IC 8.

The oscillation IC 8 includes an oscillation circuit 81 and a temperature sensor 82, and operates with a power supply voltage VOSC supplied from the control IC 4. The oscillation circuit 81 is electrically coupled to both ends of the resonator element 6, and is a circuit that causes the resonator element 6 to oscillate by amplifying an output signal of the resonator element 6 and feeding back the output signal to the resonator element 6 to output an oscillation signal OSCO. For example, the oscillation circuit 81 may be an oscillation circuit using an inverter as an amplification element, or may be an oscillation circuit using a bipolar transistor as the amplification element. The oscillation signal OSCO output from the oscillation circuit 81 is input to the control IC 4.

The temperature sensor 82 is a thermosensitive element that measures a temperature and outputs a temperature measurement signal TS1 having a voltage level corresponding to the measured temperature. The temperature sensor 82 is built in the oscillation IC 8 and measures the temperature of the oscillation IC 8. The temperature measurement signal TS1 output from the temperature sensor 82 is input to the control IC 4. The temperature sensor 82 may be, for example, a sensor that uses the temperature dependency of a forward voltage of a PN junction of a diode.

The heat generation IC 7 includes a temperature control element 71 and a temperature sensor 72. The temperature control element 71 is an element that controls the temperature of the resonator element 6 based on a temperature control signal OVC output from the control IC 4, and may be a heat generation element. For example, the temperature control element 71 is a CMOS transistor, and a heat generation amount of the temperature control element 71 changes according to a voltage of the temperature control signal OVC input to a gate. The temperature of the resonator element 6 increases as the heat generation amount of the temperature control element 71 becomes larger, and the control IC 4 controls the heat generation amount of the temperature control element 71 such that the temperature of the resonator element 6 is constant at a target set temperature. For example, the set temperature may be a fixed value such as 80° C., or may be randomly settable within a predetermined range such as a range of 70° C. or higher and 125° C.

The temperature sensor 72 is a thermosensitive element that measures a temperature and outputs a temperature measurement signal TS2 having a voltage level corresponding to the measured temperature. The temperature sensor 72 is built in the heat generation IC 7 and measures the temperature of the heat generation IC 7. Since the temperature control element 71 is also built in the heat generation IC 7, the temperature sensor 72 measures the temperature of the temperature control element 71. The temperature measurement signal TS2 output from the temperature sensor 72 is input to the control IC 4. The temperature sensor 72 may be, for example, a sensor that uses the temperature dependency of a forward voltage of a PN junction of a diode.

As shown in FIG. 3, the resonator element 6, the heat generation IC 7, and the oscillation IC 8 are accommodated in the inner-side package 3, and the control IC 4 controls the heat generation of the heat generation IC 7 such that the temperature of the resonator element 6 is kept constant. The heat generation IC 7 is a heat generation source, and radiant heat from the heat generation IC 7 is transferred to the resonator element 6 or the oscillation IC 8. Thus, a difference is generated between the temperature of the resonator element 6 or the oscillation IC 8 and the temperature of the heat generation IC 7. On the contrary, assuming that the resonator element 6 and the oscillation IC 8 are disposed apart from the heat generation IC 7 and a thermal distance between the heat generation IC 7 and the resonator element 6 is substantially the same as a thermal distance between the heat generation IC 7 and the oscillation IC 8, it can be said that the temperature of the oscillation IC 8 is close to the temperature of the resonator element 6. That is, the temperature measured by the temperature sensor 82 built in the oscillation IC 8 is closer to the temperature of the resonator element 6 than the temperature measured by the temperature sensor 72 built in the heat generation IC 7. Therefore, as will be described below, the control IC 4 controls the heat generation of the heat generation IC 7 based on the temperature measurement signal TS1 output from the temperature sensor 82. However, depending on the disposition of the resonator element 6, the heat generation IC 7, and the oscillation IC 8, the temperature of the heat generation IC 7 may be closer to the temperature of the resonator element 6 than the temperature of the oscillation IC 8. In that case, the control IC 4 may control the heat generation of the heat generation IC 7 based on the temperature measurement signal TS2 output from the temperature sensor 72.

The temperature sensor 82 is an example of "first temperature sensor", and the temperature measured by the temperature sensor 82 is an example of "first measured temperature". Alternatively, the temperature sensor 72 is another example of "first temperature sensor", and the temperature measured by the temperature sensor 72 is another example of "first measured temperature".

The control IC 4 includes a digital signal processing circuit 10, a selector 41, a temperature sensor 42, an A/D converter 43, a D/A converter 44, a fractional N-PLL circuit 45, a PLL circuit 46, a switch circuit 47, a power supply circuit 48, an interface circuit 49, a memory 90, and a register 94. PLL is an abbreviation for phase locked loop.

The power supply circuit 48 generates, based on a power supply voltage VDD supplied from the outside of the oscillator 1 and a ground voltage VSS, the power supply voltage VOSC, which is a constant voltage lower than the power supply voltage VDD. For example, the power supply circuit 48 generates the power supply voltage VOSC, which is a constant voltage, based on an output voltage of a band gap reference circuit. The power supply voltage VOSC is supplied to the oscillation IC 8.

The fractional N-PLL circuit 45 receives the oscillation signal OSCO output from the oscillation IC 8 and outputs a clock signal CK1 obtained by converting a frequency $f_{OSCO}$ of the oscillation signal OSCO into a frequency $f_{CK1}$ corresponding to a division ratio instructed by a division ratio control signal DIVC. The fractional N-PLL circuit 45 generates the clock signal CK1 by performing feedback control such that a phase of the oscillation signal OSCO matches a phase of a signal obtained by dividing the clock signal CK1 at the division ratio designated by the division ratio control signal DIVC. The division ratio control signal DIVC is subjected to delta sigma modulation, and the division ratio designated by the division ratio control signal DIVC is switched between a plurality of integer division ratios and becomes a fractional division ratio when averaging is performed. Therefore, the frequency $f_{CK1}$ is a non-integral multiple of the frequency $f_{OSCO}$. The fractional N-PLL circuit 45 may output the clock signal CK1 having the frequency $f_{CK1}$, which is different from the frequency $f_{OSCO}$ and is substantially constant regardless of an outside air temperature, according to the division ratio control signal DIVC.

The PLL circuit 46 receives the clock signal CK1 output from the fractional N-PLL circuit 45 and outputs a clock signal CK2 having a frequency $f_{CK2}$, which is the same frequency as the frequency $f_{CK1}$ of the clock signal CK1. The PLL circuit 46 generates the clock signal CK2 by performing feedback control of an input voltage of the voltage controlled oscillator 5 such that a phase of the clock signal CK1 matches a phase of the clock signal CK2 output from the voltage controlled oscillator 5.

The frequency $f_{CK1}$ of the clock signal CK1 output from the fractional N-PLL circuit 45 is a non-integral multiple of the frequency $f_{OSCO}$ of the oscillation signal OSCO, and the clock signal CK1 has large jitter. On the contrary, the frequency $f_{CK2}$ of the clock signal CK2 output from the PLL circuit 46 is the same as the frequency $f_{CK1}$ of the clock signal CK1, and the clock signal CK2 is output from the voltage controlled oscillator 5 using the resonator element 55 having high frequency stability. Thus, the clock signal CK2 has smaller jitter than the clock signal CK1.

The switch circuit 47 outputs a clock signal CK selected from any one of the clock signal CK1 or the clock signal CK2, according to a logic level of a switch control signal SWC output from the register 94. The clock signal CK is output to the outside of the oscillator 1. The clock signal CK may be supplied to an external device 100 or may be supplied to a device different from the external device 100. For example, the clock signal CK2 having small jitter may be selected as the clock signal CK during a normal operation of the oscillator 1, and the clock signal CK1 may be selected as the clock signal CK when the clock signal CK1 is inspected.

The temperature sensor 42 is a thermosensitive element that measures a temperature and outputs a temperature measurement signal TS3 having a voltage level corresponding to the measured temperature. The temperature sensor 42 is built in the control IC 4 and measures the temperature of the control IC 4. As shown in FIG. 1, the control IC 4 is disposed at a place close to the outer-side lid 22, a distance between the resonator element 6 and the temperature sensor 42 is larger than a distance between the resonator element 6 and the temperature sensor 82 included in the oscillation IC 8, and the temperature of the control IC 4 is easily affected by the temperature of the outside air of the oscillator 1. Therefore, assuming that the heat generation amount of the control IC 4 is substantially constant, the temperature sensor 42 can measure a temperature change in the outside air of the oscillator 1. The temperature measurement signal TS2 output from the temperature sensor 72 is input to the control IC 4. The temperature sensor 72 may be, for example, a sensor that uses the temperature dependency of a forward voltage of a PN junction of a diode.

The selector 41 selects and outputs any one of the temperature measurement signal TS1 output from the oscillation IC 8, the temperature measurement signal TS2 output from the heat generation IC 7, or the temperature measurement signal TS3 output from the temperature sensor 42. In the present embodiment, the selector 41 selects the temperature measurement signals TS1, TS2, and TS3 in a time division and periodically outputs the temperature measurement signals.

The A/D converter 43 converts the temperature measurement signals TS1, TS2, and TS3, which are analog signals output from the selector 41 in a time division, into temperature codes DTS1, DTS2, and DTS3, which are digital signals, respectively. In the A/D converter 43, the temperature measurement signals TS1, TS2, and TS3 may be subjected to voltage level conversion using resistance division or the like and then converted into the temperature codes DTS1, DTS2, and DTS3.

The digital signal processing circuit 10 includes a temperature control circuit 11 and a temperature compensation circuit 12.

The temperature control circuit 11 generates a control signal for controlling an operation of the temperature control element 71 built in the heat generation IC 7. Specifically, the temperature control circuit 11 outputs a temperature control code DOVC to control the heat generation amount of the temperature control element 71, based on the temperature code DTS1 and temperature control data 91 stored in the non-volatile memory 90. For example, the temperature control data 91 may include information regarding the target set temperature of the resonator element 6 or information regarding a gain for controlling the heat generation amount of the temperature control element 71. Alternatively, when the target set temperature of the resonator element 6 fluctuates depending on the outside air temperature, the temperature control data 91 may include information indicating a relationship between the temperature code DTS3 and the set temperature. In this case, the temperature control circuit 11 outputs the temperature control code DOVC based on the temperature codes DTS1 and DTS3 and the temperature control data 91.

The temperature compensation circuit 12 performs temperature compensation on the frequency of the oscillation signal OSCO generated by causing the resonator element 6 to oscillate by the oscillation circuit 81 built in the oscillation IC 8. Specifically, the temperature compensation circuit 12 outputs the division ratio control signal DIVC for causing the fractional N-PLL circuit 45 to output the clock signal CK1 having a constant frequency regardless of the temperature, based on the temperature code DTS3 and temperature compensation data 92 stored in the memory 90. For example, the temperature compensation data 92 may be table information indicating a relationship between the temperature code DTS3 and the frequency of the oscillation signal OSCO, or may be information regarding a coefficient value of each order of a formula indicating the relationship. Alternatively, the temperature compensation data 92 may be information indicating a relationship between the temperature code DTS3 and a value of a fractional division ratio of the fractional N-PLL circuit 45, which is calculated from the relationship between the temperature code DTS3 and the frequency of the oscillation signal OSCO.

The temperature control circuit 11 may be a hardware circuit that performs temperature control processing of controlling the operation of the temperature control element 71. Similarly, the temperature compensation circuit 12 may be a hardware circuit that performs temperature compensation processing of performing the temperature compensation on the frequency of the oscillation signal OSCO. Alternatively, the digital signal processing circuit 10 may include a CPU and a non-volatile memory, and the CPU may perform the temperature control processing of controlling the operation of the temperature control element 71 based on a temperature control program stored in the memory. CPU is an abbreviation for central processing unit. That is, the CPU may execute the temperature control program to function as the temperature control circuit 11. Similarly, the CPU may perform the temperature compensation processing of performing the temperature compensation on the frequency of the oscillation signal OSCO based on the temperature compensation program stored in the memory. That is, the CPU may execute the temperature compensation program to function as the temperature compensation circuit 12. Details of the temperature control processing and the temperature compensation processing by the digital signal processing circuit 10 will be described below.

The D/A converter 44 converts the temperature control code DOVC, which is a digital signal output from the temperature control circuit 11, into the temperature control signal OVC, which is an analog signal. The temperature control signal OVC is supplied to the temperature control element 71 of the heat generation IC 7.

The interface circuit 49 is a circuit that performs data communication between the oscillator 1 and the external device 100 coupled to the oscillation 1. Specifically, the interface circuit 49 writes or reads out data to and from the memory 90 or the register 94, in response to a request from the external device 100. The interface circuit 49 may be, for example, an interface circuit corresponding to an I$^2$C bus or an interface circuit corresponding to an SPI bus. I$^2$C is an abbreviation for inter-integrated circuit. Further, SPI is an abbreviation for serial peripheral interface.

In an inspection step when the oscillator 1 is manufactured, the inspection device, which is the external device 100, may set the switch control signal SWC for causing the switch circuit 47 to select the clock signal CK1 via the interface circuit 49 to inspect the clock signal CK1. Further, the inspection device, which is the external device 100, writes the temperature control data 91 and the temperature compensation data 92 in the memory 90 via the interface circuit 49. The temperature control data 91 and the temperature compensation data 92 may be set in the register 94 by the external device 100 when the oscillator 1 is started.

1-3. Temperature Control Processing by Digital Signal Processing Circuit

Figure 6:
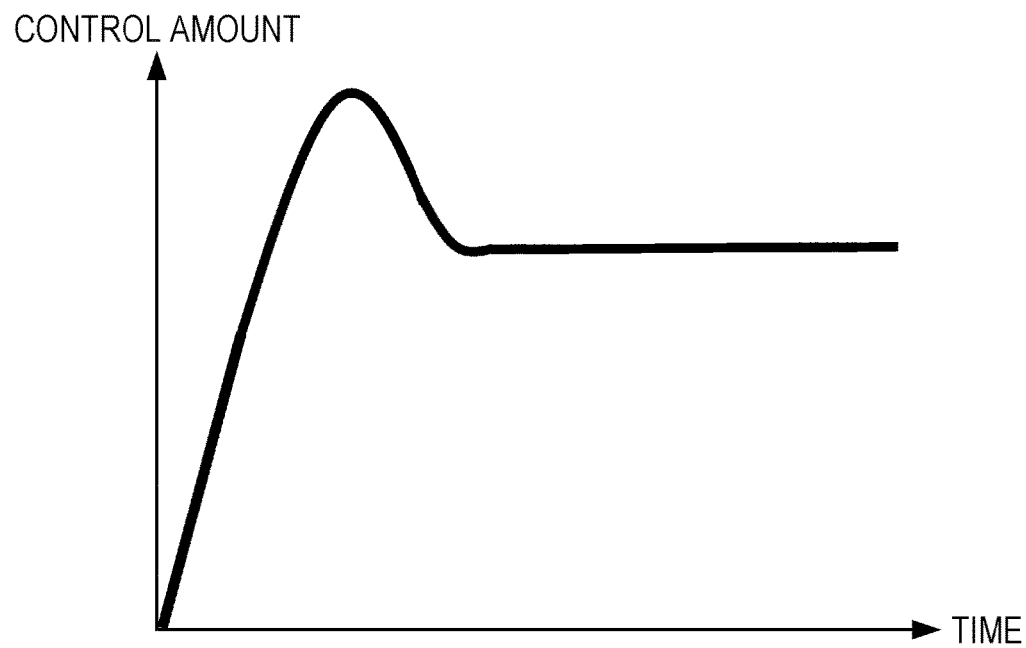
FIG. 6 is a graph showing an outline of a time change in a control amount of a temperature control element according to a first embodiment.
Figure 7:
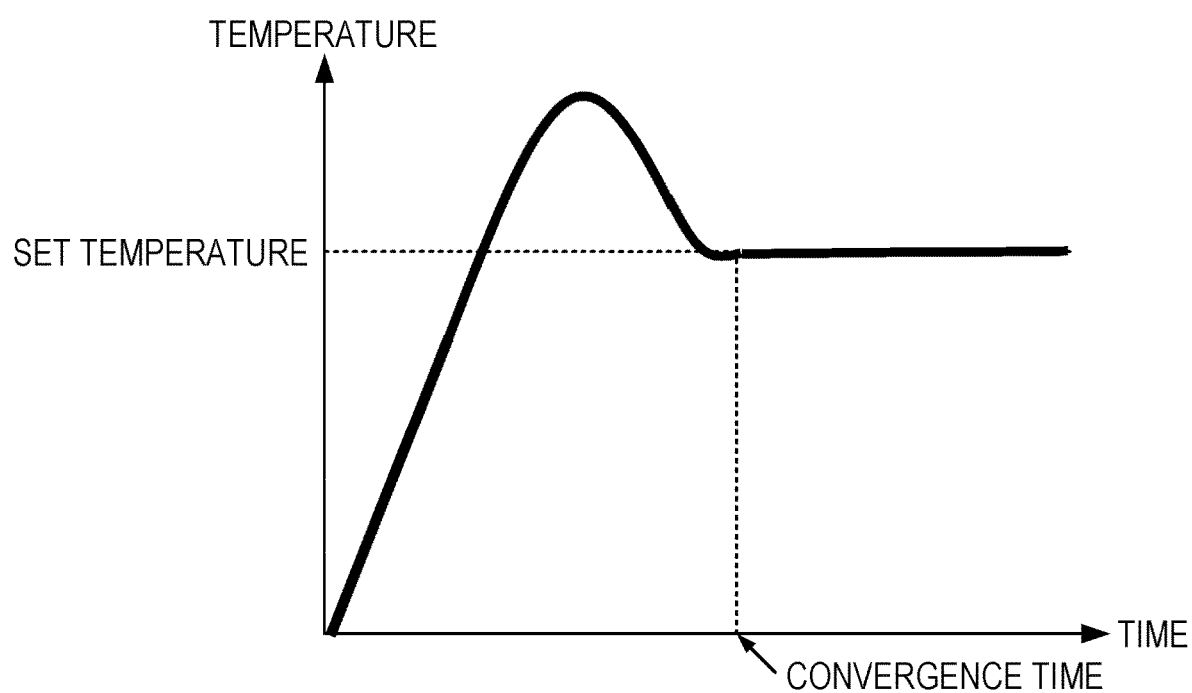
FIG. 7 is a graph showing an outline of a time change in a temperature of a resonator element according to the first embodiment.

In the present embodiment, in the digital signal processing circuit 10, the temperature control circuit 11 performs the temperature control processing of controlling the heat generation amount of the temperature control element 71 such that a difference between the target set temperature of the resonator element 6 and the temperature of the resonator element 6 is brought close to zero. FIGS. 6 and 7 are graphs showing an outline of time changes in a control amount of the temperature control element 71 and a temperature of the resonator element 6 in the temperature control processing, respectively.

For example, when the set temperature is 80° C., the temperature of the resonator element 6 is close to the outside air temperature at a time of start of the oscillator 1. Thus, as shown in FIGS. 6 and 7, the control amount of the temperature control element 71 increases to cause the temperature control element 71 to generate heat, and as a result, the temperature of the resonator element 6 increases. When the temperature of the resonator element 6 reaches the set temperature, then the control amount of the temperature control element 71 reaches a peak and decreases. Accordingly, the temperature of the resonator element 6 exceeds the set temperature, reaches a peak, and then decreases. As the temperature of the resonator element 6 is closer to the set temperature, a decrease rate of the control amount becomes smaller and becomes a constant value. As a result, the temperature of the resonator element 6 also converges to the set temperature.

Figure 8:
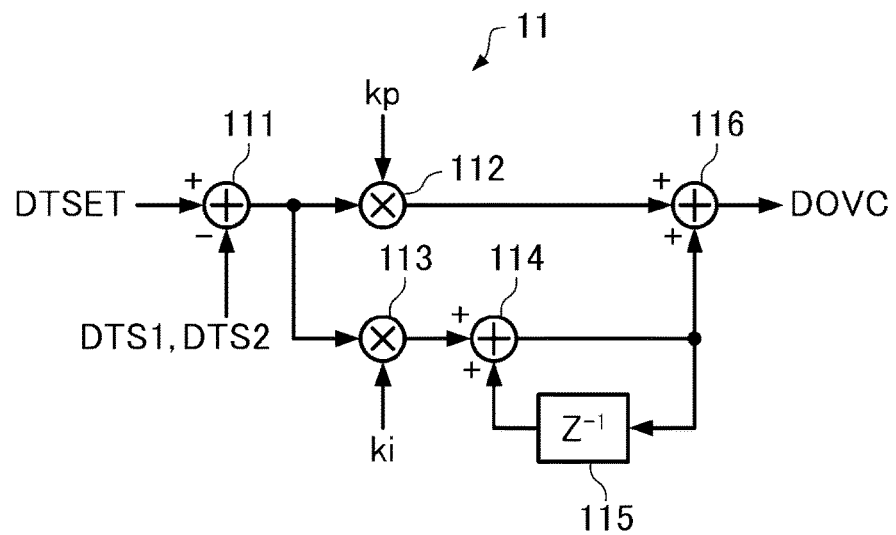
FIG. 8 is a diagram showing a configuration example of a temperature control circuit according to the first embodiment.

FIG. 8 is a diagram showing a configuration of the temperature control circuit 11 according to the first embodiment. As shown in FIG. 8, the temperature control circuit 11 includes a subtractor 111, multipliers 112 and 113, an adder 114, a delay element 115, and an adder 116.

The subtractor 111 outputs a value obtained by subtracting the temperature code DTS1 from a set temperature code DTSET. The set temperature code DTSET is a digital code corresponding to the set temperature, and is included in the temperature control data 91. Further, as described above, the temperature code DTS1 is a digital code corresponding to a voltage of the temperature measurement signal TS1 output from the oscillation IC 8.

The multiplier 112 outputs a product of the output value of the subtractor 111 and a gain kp. The multiplier 113 outputs a product of the output value of the subtractor 111 and a gain ki. The gains kp and Ki are included in the temperature control data 91.

The adder 114 outputs a value obtained by adding an output value of the multiplier 113 and an output value of the delay element 115. The delay element 115 outputs the output value of the adder 114 with a delay of a predetermined time. For example, the predetermined time may be a time corresponding to a cycle in which the A/D converter 43 updates the temperature code DTS1.

The adder 116 adds an output value of the multiplier 112 and the output value of the adder 114 to output the temperature control code DOVC.

The temperature control circuit 11 having such a configuration realizes the control of the heat generation amount of the temperature control element 71 by PI control. The output value of the multiplier 112 corresponds to a value of a proportional term P, and the output value of the adder 114 corresponds to a value of an integral term I.

In the example of FIG. 8, the temperature code DTS1 is input to the subtractor 111, assuming that the temperature of the oscillation IC 8 is closer to the temperature of the resonator element 6 than the temperature of the heat generation IC 7. However, when the temperature of the heat generation IC 7 is closer to the temperature of the resonator element 6 than the temperature of the oscillation IC 8, the temperature code DTS2 corresponding to a voltage of the temperature measurement signal TS2 output from the heat generation IC 7 may be input to the subtractor 111.

As described above, the temperature control circuit 11 outputs the temperature control code DOVC, which is the control signal for controlling the operation of the temperature control element 71 based on a value obtained by multiplying a difference between the set temperature and the measured temperature measured by the temperature sensor 82 or the temperature sensor 72 by the gain. With the temperature control signal OVC obtained by converting the temperature control code DOVC by the D/A converter 44, the heat generation amount of the temperature control element 71 is controlled such that the temperature of the resonator element 6 is kept constant.

Here, the gains kp and Ki for controlling the heat generation amount of the temperature control element 71 are included in the temperature control data 91 stored in the memory 90, and the external device 100 is configured to set the temperature control data 91 via the interface circuit 49.

That is, the gains kp and Ki are variable. Therefore, since the gains kp and Ki can be set to optimum values according to the use environment or the like of the oscillator 1, the stability of the temperature of the resonator element 6 is ensured and the frequency accuracy of the oscillation signal OSCO is improved.

1-4. Temperature Compensation Processing by Digital Signal Processing Circuit

In the present embodiment, in the digital signal processing circuit 10, the temperature compensation circuit 12 performs the temperature compensation processing of correcting the fluctuation of the frequency of the oscillation signal OSCO caused by the slight fluctuation of the temperature of the resonator element 6 due to the influence of the outside air temperature of the oscillator 1.

Figure 9:
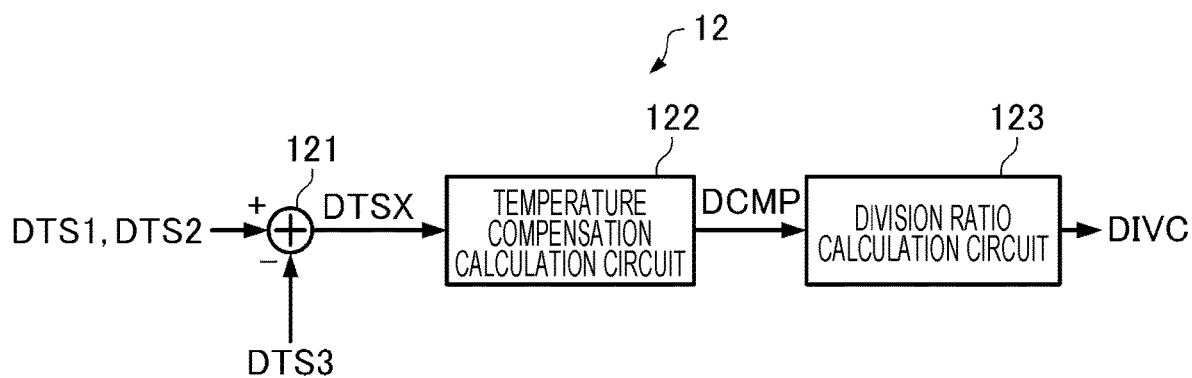
FIG. 9 is a diagram showing a configuration example of a temperature compensation circuit according to the first embodiment.

FIG. 9 is a diagram showing a configuration example of the temperature compensation circuit 12. As shown in FIG. 9, the temperature compensation circuit 12 includes a subtractor 121, a temperature compensation calculation circuit 122, and a division ratio calculation circuit 123.

The subtractor 121 subtracts the temperature code DTS3 from the temperature code DTS1 and outputs a temperature code DTSX. As described above, the temperature code DTS1 is a digital code corresponding to the voltage of the temperature measurement signal TS1 output from the oscillation IC 8. Further, the temperature code DTS3 is a digital code corresponding to the voltage of the temperature measurement signal TS3 output from the temperature sensor 42.

The temperature compensation calculation circuit 122 calculates a temperature compensation code DCMP for performing the temperature compensation on the frequency of the oscillation signal OSCO based on the temperature code DTSX output from the subtractor 121. The temperature compensation calculation circuit 122 may calculate the temperature compensation code DCMP by a polynomial equation shown in Equation (1), in which the temperature code DTSX output from the subtractor 121 is set as a variable. Specifically, the temperature compensation calculation circuit 122 substitutes the temperature code DTSX into Equation (1) to calculate the temperature compensation code DCMP. Coefficients $a_n$ to $a_0$ in Equation (1) are included in the temperature compensation data 92. n is an integer of two or more, and is preferably three or more in order to perform the temperature compensation on the frequency of the oscillation signal OSCO with high accuracy.

$$DCMP = a_n \cdot DTSX^n + a_{n-1} \cdot DTSX^{n-1} + \ldots + a_1 \cdot DTSX + a_0 \quad (1)$$

The division ratio calculation circuit 123 calculates a division ratio of the fractional N-PLL circuit 45 based on the temperature compensation code DCMP calculated by the temperature compensation calculation circuit 122. Specifically, the division ratio calculation circuit 123 calculates the division ratio of the fractional N-PLL circuit 45 based on the temperature compensation code DCMP calculated by the temperature compensation calculation circuit 122 and performs the delta sigma modulation on the division ratio to generate the division ratio control signal DIVC. The fractional N-PLL circuit 45 performs the temperature compensation on the frequency of the oscillation signal OSCO, and thus the clock signal CK1 having high frequency accuracy is obtained.

As described above, the temperature compensation circuit 12 performs the temperature compensation on the frequency of the oscillation signal OSCO based on the difference between the measured temperature measured by the temperature sensor 82 and the measured temperature measured by the temperature sensor 42.

In the example of FIG. 9, the temperature code DTS1 is input to the subtractor 121, assuming that the temperature of the oscillation IC 8 is closer to the temperature of the resonator element 6 than the temperature of the heat generation IC 7. However, when the temperature of the heat generation IC 7 is closer to the temperature of the resonator element 6 than the temperature of the oscillation IC 8, the temperature code DTS2 corresponding to the voltage of the temperature measurement signal TS2 output from the heat generation IC 7 may be input to the subtractor 121.

1-5. Action and Effect

As described above, in the oscillator 1 according to the first embodiment, the gains kp and Ki for controlling the operation of the temperature control element 71, which controls the temperature of the resonator element 6, are stored in the memory 90 and are variable. In particular, since the temperature control circuit 11 that controls the temperature of the resonator element 6 is realized by the digital signal processing circuit 10, the gains kp and Ki are easily changed. Therefore, with the oscillator 1 according to the first embodiment, the temperature of the resonator element 6 can be appropriately controlled by setting, in the memory 90, the appropriate gains kp and Ki according to various situations such as the application or the operation environment. For example, the temperature fluctuation of the resonator element 6 can be reduced by setting the gains kp and Ki to high values in an environment in which the outside air temperature is low and setting the gains kp and Ki to low values in an environment in which the outside air temperature is high. Since the fluctuation of the oscillation frequency caused by temperature characteristics of the resonator element 6 is smaller as the temperature fluctuation of the resonator element 6 is smaller, the frequency accuracy of the oscillation signal OSCO is improved.

2. Second Embodiment

Hereinafter, regarding a second embodiment, the same reference numerals will be assigned to the same configurations as those of the first embodiment, the same description as that of the first embodiment will be omitted or simplified, and contents different from those of the first embodiment will be mainly described.

Since a structure of the oscillator 1 according to the second embodiment is the same as that in FIGS. 1 to 4, the illustration and description thereof will be omitted. Further, since a functional block diagram of the oscillator 1 according to the second embodiment is the same as that in FIG. 5, the illustration thereof will be omitted.

Figure 10:
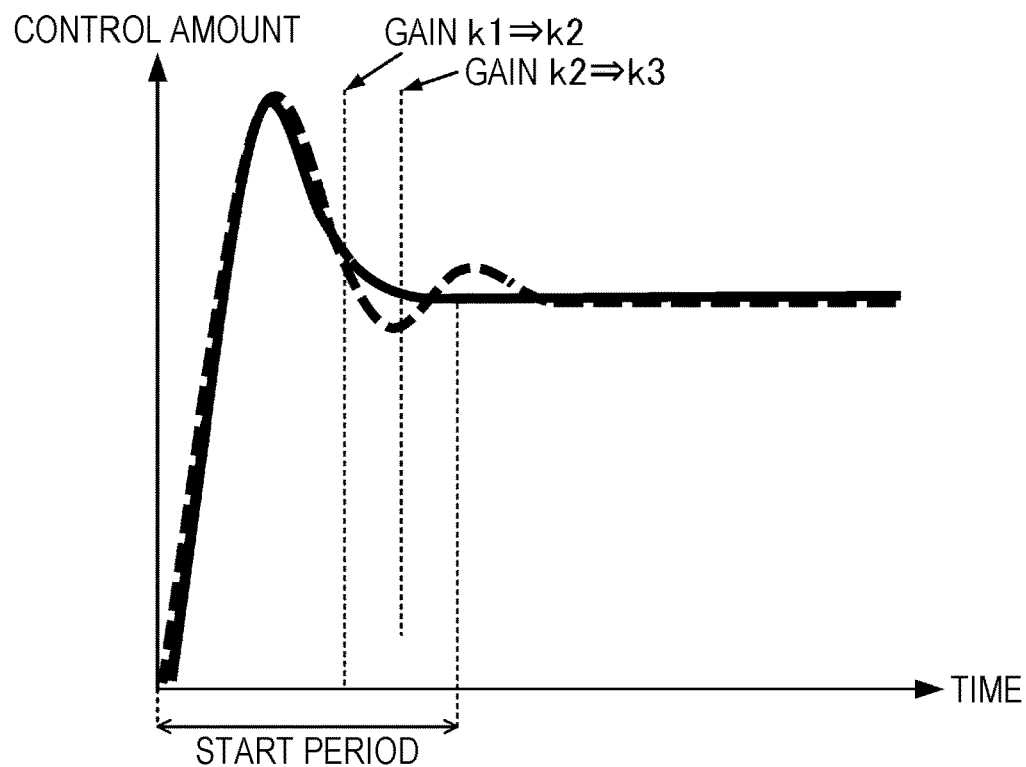
FIG. 10 is a graph showing an outline of a time change in a control amount of a temperature control element according to a second embodiment.
Figure 11:
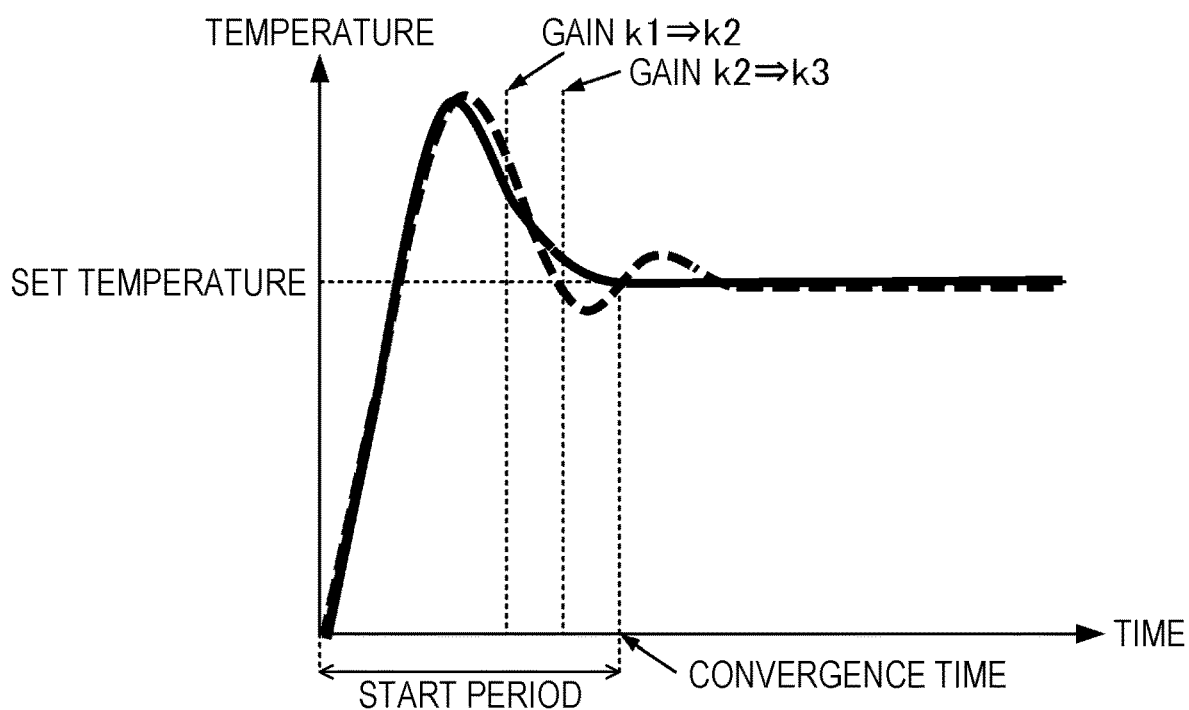
FIG. 11 is a graph showing an outline of a time change in a temperature of a resonator element according to the second embodiment.

In the second embodiment, in the digital signal processing circuit 10, the temperature control circuit 11 performs high-speed start control of controlling the heat generation amount of the temperature control element 71 such that the difference between the target set temperature of the resonator element 6 and the temperature of the resonator element 6 is brought close to zero at a high speed after the oscillator 1 is started. FIGS. 10 and 11 are graphs showing an outline of time changes in the control amount of the temperature control element 71 and the temperature of the resonator element 6 in the second embodiment, respectively.

As shown in FIGS. 10 and 11, in a start period after the temperature control element 71 starts to operate, the control amount of the temperature control element 71 increases to cause the temperature control element 71 to generate heat, and as a result, the temperature of the resonator element 6 increases. When the start period is started, the gain for controlling the temperature control element 71 is set to a first value k1 larger than that during the normal control, and an increase rate of the control amount or the temperature is large as compared with the case of the normal control shown in FIGS. 6 and 7. Therefore, the temperature of the resonator element 6 reaches the set temperature at an early stage, and then the control amount of the temperature control element 71 reaches a peak and decreases. Accordingly, the temperature of the resonator element 6 exceeds the set temperature, reaches a peak, and then decreases. In the high-speed start control, the decrease rate of the control amount or the temperature is also large as compared with the case of the normal control shown in FIGS. 6 and 7. Thereafter, the gain is switched to a second value k2 smaller than the first value k1, the gain is further switched to a third value k3 smaller than the second value k2, and as the temperature of the resonator element 6 is closer to the set temperature, a decrease rate of the control amount becomes smaller and becomes a constant value. As a result, the temperature of the resonator element 6 also converges to the set temperature, and the start period is ended. For example, the third value k3 is the same as the value of the gain during the normal control. FIGS. 10 and 11 respectively show, by broken lines, time changes in the control amount of the temperature control element 71 and the temperature of the resonator element 6 when the gain maintains the first value k1 in the start period. When the gain maintains the first value k1 in the start period, the gain is too large, and thus, it takes time for the control amount or the temperature to converge to a constant value.

Figure 12:
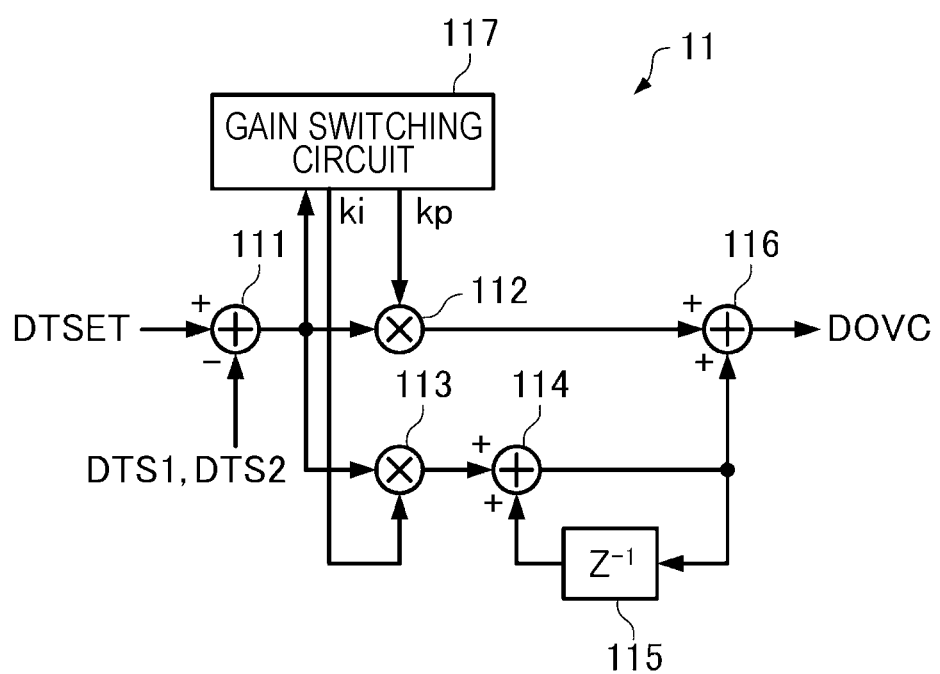
FIG. 12 is a diagram showing a configuration example of a temperature control circuit according to the second embodiment.

FIG. 12 is a diagram showing a configuration example of the temperature control circuit 11 to realize the high-speed start control. In FIG. 12, the same reference numerals are assigned to the same components as those in FIG. 8. As shown in FIG. 12, the temperature control circuit 11 includes the subtractor 111, the multipliers 112 and 113, the adder 114, the delay element 115, the adder 116, and a gain switching circuit 117. Since the subtractor 111, the multipliers 112 and 113, the adder 114, the delay element 115, and the adder 116 operate as described above, the description thereof will be omitted.

The gain switching circuit 117 switches, based on the output value of the subtractor 111 which is a difference between the set temperature code DTSET and the temperature code DTS1, the gains kp and Ki from the first values kp1 and Ki1 to the second values kp2 and Ki2, respectively, and then further performs the switching from the second values kp2 and Ki2 to the third values kp3 and Ki3. For example, when the output value of the subtractor 111 becomes the maximum and then becomes equal to or less than a predetermined first threshold value, the gain switching circuit 117 switches the gains kp and Ki respectively from first values kp1 and Ki1 to second values kp2 and Ki2. Here, when the difference between the set temperature and the temperature measured by the temperature sensor 82 or the temperature sensor 72 is a first temperature difference, the output value of the subtractor 111 matches the first threshold value. Further, when the gains kp and Ki are respectively switched from the first values kp1 and Ki1 to the second values kp2 and Ki2 and then the output value of the subtractor 111 becomes equal to or less than a predetermined second threshold value, the gain switching circuit 117 switches the gains kp and Ki respectively from the second values kp2 and Ki2 to the third values kp3 and Ki3. Here, when the difference between the set temperature and the temperature measured by the temperature sensor 82 or the temperature sensor 72 is a second temperature difference smaller than the first temperature difference, the output value of the subtractor 111 matches the second threshold value. The first threshold value and the second threshold value are decided as appropriate based on a simulation result or an evaluation result such that the control amount of the temperature control element 71 or the temperature of the resonator element 6 does not change with time shown by broken lines in FIGS. 10 and 11, but changes with time shown by solid lines in FIGS. 10 and 11.

In the examples of FIGS. 10 and 11, the temperature control circuit 11 switches and decreases the gain in two stages in the start period, but may switch and decrease the gain in one stage, or may switch and decrease the gain in three or more stages.

As described above, in the start period after the temperature control element 71 starts to operate, when the difference between the set temperature and the temperature measured by the temperature sensor 82 or the temperature sensor 72 is equal to or less than the first temperature difference, the temperature control circuit 11 switches the gains kp and Ki respectively from the first values kp1 and Ki1 to the second values kp2 and Ki2 smaller than the first values kp1 and Ki1. Further, in the start period after the temperature control element 71 starts to operate, when the difference between the set temperature and the temperature measured by the temperature sensor 82 or the temperature sensor 72 is equal to or less than the second temperature difference smaller than the first temperature difference, the temperature control circuit 11 switches the gains kp and Ki respectively from the second values kp2 and Ki2 to the third values kp3 and Ki3 smaller than the second values kp2 and Ki2.

The temperature control circuit 11 performs the normal control as in the first embodiment after the end of the start period. In the temperature control circuit 11, with the high-speed start control in the start period, a time until the temperature of the resonator element 6 converges to the set temperature can be shortened, as compared with when the normal control is performed, even in the start period.

Other configurations and functions of the oscillator 1 according to the second embodiment are the same as those in the first embodiment, and thus the description thereof will be omitted.

As described above, in the oscillator 1 according to the second embodiment, the temperature of the resonator element 6 is close to the set temperature in a short time by setting the gains kp and Ki to the first values kp1 and Ki1 at the initial stage of the start period, and the temperature of the resonator element 6 converges to the set temperature in a short time by decreasing the gains kp and Ki to the second values kp2 and Ki2 when the temperature of the resonator element 6 is close to the set temperature to some extent. Therefore, with the oscillator 1 according to the second embodiment, a time until the temperature of the resonator element 6 is stabilized at the set temperature can be shortened. Further, the temperature of the resonator element 6 converges to the set temperature in a further short time by decreasing the gains kp and Ki from the second values kp2 and Ki2 to the third values kp3 and Ki3 when the temperature of the resonator element 6 is further close to the set temperature. Therefore, the time until the temperature of the resonator element 6 is stabilized at the set temperature can be further shortened. As a result, a time until the frequency of the oscillation signal OSCO is stabilized at a target frequency is shortened.

Further, in the oscillator 1 according to the second embodiment, with the switching of the gains kp and Ki in the start period, the temperature control circuit 11 can cause the temperature of the resonator element 6 to converge to the set temperature in a short time by the simple PI control. Therefore, with the oscillator 1 according to the second embodiment, differentiation control (D control) by the temperature control circuit 11 is not required, and thus a circuit scale of the circuit of the control IC 4 is reduced, which is advantageous in terms of size and cost reduction.

3. Third Embodiment

Hereinafter, regarding a third embodiment, the same reference numerals will be assigned to the same configurations as those of the first embodiment or the second embodiment, the same description as that of the first embodiment or the second embodiment will be omitted or simplified, and contents different from those of the first embodiment or the second embodiment will be mainly described.

Since a structure of the oscillator 1 according to the third embodiment is the same as that in FIGS. 1 to 4, the illustration and description thereof will be omitted. Further, since a functional block diagram of the oscillator 1 according to the third embodiment is the same as that in FIG. 5, the illustration thereof will be omitted.

Figure 13:
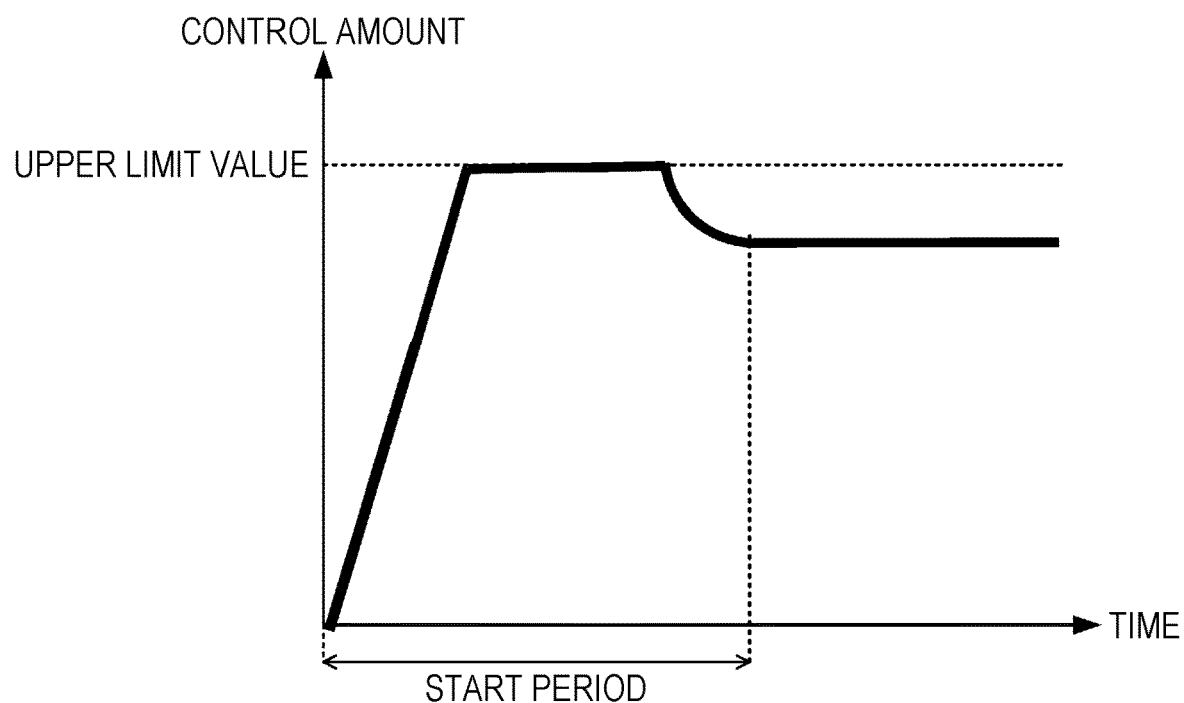
FIG. 13 is a graph showing an outline of a time change in a control amount of a temperature control element according to a third embodiment.
Figure 14:
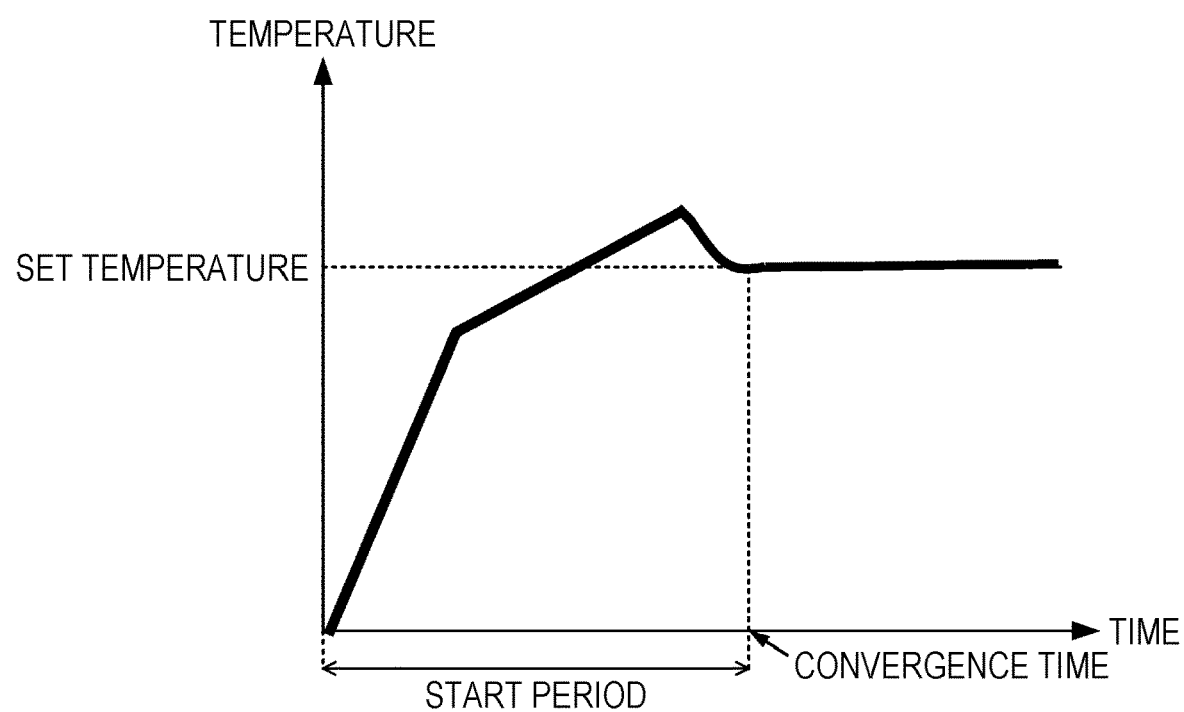
FIG. 14 is a graph showing an outline of a time change in temperature of a resonator element according to the third embodiment.

In the third embodiment, in the digital signal processing circuit 10, the temperature control circuit 11 performs maximum power suppression control of controlling the heat generation amount of the temperature control element 71 such that power consumption by the temperature control element 71 is limited to a predetermined upper limit value or less after the oscillator 1 is started. FIGS. 13 and 14 are graphs showing an outline of time changes in the control amount of the temperature control element 71 and the temperature of the resonator element 6 in the third embodiment, respectively.

As shown in FIGS. 13 and 14, in the start period after the temperature control element 71 starts to operate, the control amount of the temperature control element 71 increases to cause the temperature control element 71 to generate heat, and as a result, the temperature of the resonator element 6 increases. The gain for controlling the temperature control element 71 is set to the same value as during the normal control, and the increase rate of the control amount or the temperature is the same as that in the case of the normal control shown in FIGS. 6 and 7. Thereafter, when the control amount reaches a preset upper limit value, the upper limit value is maintained. In a period during which the control amount maintains the upper limit value, the increase rate of the temperature of the resonator element 6 decreases. Thereafter, the temperature of the resonator element 6 reaches the set temperature, and the control amount of the temperature control element 71 decreases from the upper limit value. Accordingly, the temperature of the resonator element 6 exceeds the set temperature, reaches a peak, and then decreases. The decrease rate of the control amount or the temperature is the same as that in the case of the normal control shown in FIGS. 6 and 7. Thereafter, as the temperature of the resonator element 6 is closer to the set temperature, the decrease rate of the control amount becomes smaller and becomes a constant value. As a result, the temperature of the resonator element 6 also converges to the set temperature, and the start period is ended.

Figure 15:
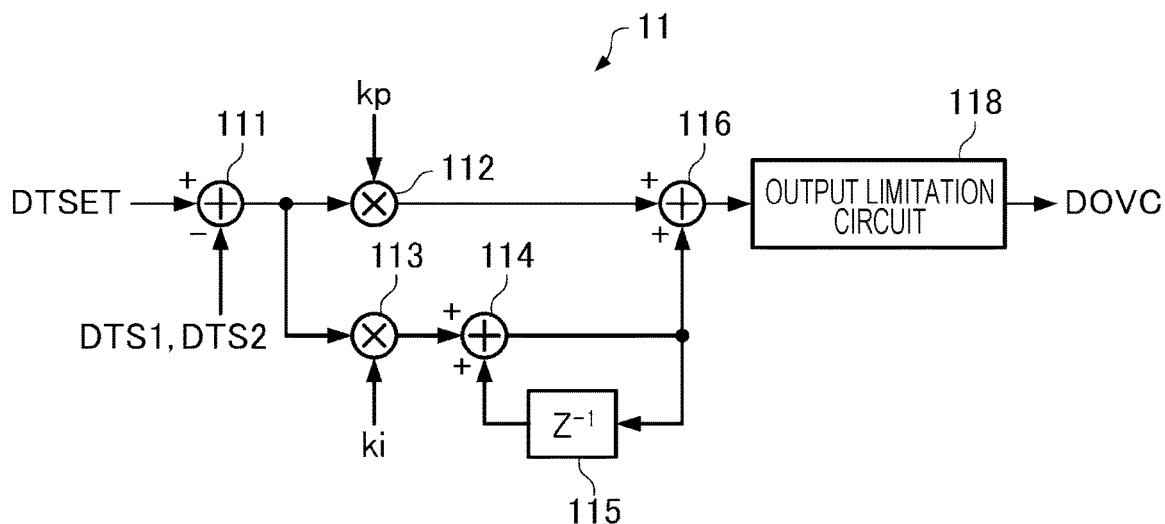
FIG. 15 is a diagram showing a configuration example of a temperature control circuit according to the third embodiment.

FIG. 15 is a diagram showing a configuration example of the temperature control circuit 11 to realize the maximum power suppression control. In FIG. 15, the same reference numerals are assigned to the same components as those in FIG. 8. As shown in FIG. 15, the temperature control circuit 11 includes the subtractor 111, the multipliers 112 and 113, the adder 114, the delay element 115, the adder 116, and an output limitation circuit 118. Since the subtractor 111, the multipliers 112 and 113, the adder 114, the delay element 115, and the adder 116 operate as described above, the description thereof will be omitted.

The output limitation circuit 118 compares the output value of the adder 116 with a predetermined upper limit value, and outputs the output value of the adder 116 as the temperature control code DOVC when the output value of the adder 116 is equal to or less than the upper limit value and outputs the upper limit value as the temperature control code DOVC when the output value of the adder 116 is larger than the upper limit value. The upper limit value is decided as appropriate based on a simulation result or an evaluation result such that the power consumption by the temperature control element 71 is the preset upper limit value.

As described above, the temperature control circuit 11 limits the power consumption by the temperature control element 71 to the predetermined upper limit value or less in the start period after the temperature control element 71 starts to operate. The temperature control circuit 11 performs the normal control after the end of the start period.

With the oscillator 1 according to the third embodiment described above, the temperature control circuit 11 performs the maximum power suppression control in the start period and thus the time until the temperature of the resonator element 6 converges to the set temperature is lengthened, but stable operations of various systems using the oscillator 1 can be ensured and a degree of freedom in designing the systems is improved, as compared with when the normal control is performed, even in the start period.

4. Fourth Embodiment

Hereinafter, regarding a fourth embodiment, the same reference numerals will be assigned to the same configurations as those of any of the first to third embodiments, the same description as that of any of the first to third embodiments will be omitted or simplified, and contents different from those of any of the first to third embodiments will be mainly described.

Since a structure of the oscillator 1 according to the fourth embodiment is the same as that in FIGS. 1 to 4, the illustration and description thereof will be omitted. Further, since a functional block diagram of the oscillator 1 according to the fourth embodiment is the same as that in FIG. 5, the illustration thereof will be omitted.

In the fourth embodiment, in the digital signal processing circuit 10, the temperature compensation circuit 12 performs first temperature compensation such that the frequency of the oscillation signal OSCO is brought close to the target frequency at a high speed, based on the temperature code DTS1, in the start period from the start of the oscillator 1 to the time until the temperature of the resonator element 6 is stabilized. Further, in the digital signal processing circuit 10, the temperature compensation circuit 12 performs second temperature compensation that suppresses the fluctuation of the frequency of the oscillation signal OSCO from the target frequency, based on the difference between the temperature code DTS1 and the temperature code DTS3.

Figure 16:
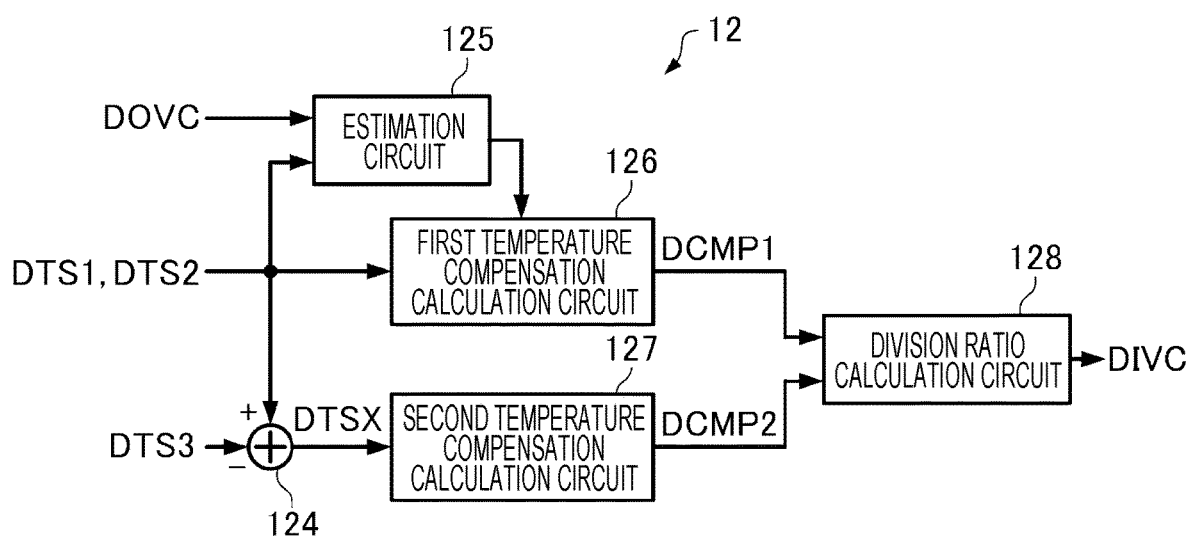
FIG. 16 is a diagram showing a configuration example of a temperature compensation circuit according to a fourth embodiment.

FIG. 16 is a diagram showing a configuration example of the temperature compensation circuit 12 according to the fourth embodiment. As shown in FIG. 16, the temperature compensation circuit 12 in the fourth embodiment includes a subtractor 124, an estimation circuit 125, a first temperature compensation calculation circuit 126, a second temperature compensation calculation circuit 127, and a division ratio calculation circuit 128.

The first temperature compensation calculation circuit 126 calculates a first temperature compensation code DCMP1 for performing the first temperature compensation on the frequency of the oscillation signal OSCO based on the temperature code DTS1. The first temperature compensation calculation circuit 126 may calculate the first temperature compensation code DCMP1 by a polynomial equation shown in Equation (2), in which the temperature code DTS1 is set as a variable. Specifically, the first temperature compensation calculation circuit 126 substitutes the temperature code DTS1 into Equation (2) to calculate the first temperature compensation code DCMP1. Coefficients $b_m$ to $b_0$ in Equation (2) are estimated by the estimation circuit 125. m is an integer of two or more, and is preferably three or more in order to perform the temperature compensation on the frequency of the oscillation signal OSCO with high accuracy.

$$DCMP1 = b_m \cdot DTS1^m + b_{m-1} \cdot DTS1^{m-1} + \ldots + b_1 \cdot DTS1 + b_0 \quad (2)$$

As described above, the first temperature compensation calculation circuit 126 calculates the first temperature compensation code DCMP1 as a first temperature compensation value for performing the temperature compensation on the frequency of the oscillation signal OSCO, based on the temperature compensation coefficients $b_m$ to $b_0$ estimated by the estimation circuit 125 and the temperature measured by the temperature sensor 82. With the operation of the first temperature compensation calculation circuit 126 in the start period, the frequency of the oscillation signal OSCO can be brought close to the target frequency at a high speed.

As described above, the temperature control circuit 11 controls the heat generation amount of the temperature control element 71 such that the difference between the target set temperature of the resonator element 6 and the temperature of the resonator element 6 is brought close to zero. Specifically, the temperature control circuit 11 controls the heat generation amount of the temperature control element 71 such that the difference between the set temperature and the temperature measured by the temperature sensor 82 is brought close to zero, assuming that the temperature measured by the temperature sensor 82 is close to the temperature of the resonator element 6. Accordingly, the heat generation amount of the temperature control element 71 is controlled in the start period after the temperature control element 71 starts to operate, and the temperature measured by the temperature sensor 82 is stabilized at the set temperature after the end of the start period. However, the temperature measured by the temperature sensor 82 does not accurately match the temperature of the resonator element 6, and the temperature of the resonator element 6 after the end of the start period is stabilized at a temperature according to the outside air temperature at the time of start. Specifically, the resonator element 6 is stabilized at a lower temperature as the outside air temperature at the start is lower, and is stabilized at a higher temperature as the outside air temperature at the time of start is higher. That is, a difference between the temperature at which the resonator element 6 is stabilized and the set temperature is generated depending on the outside air temperature at the time of start. As a result, when the temperature compensation coefficients $b_m$ to $b_0$ are fixed values, a difference between the frequency of the oscillation signal OSCO and the target frequency is generated in the start period.

In the present embodiment, the estimation circuit 125 estimates the optimum temperature compensation coefficients $b_m$ to $b_0$. Specifically, the estimation circuit 125 estimates the temperature compensation coefficients $b_m$ to $b_0$ based on the temperature control code DOVC and the temperature code DTS1 in an initial period in which the temperature control element 71 starts to operate.

For example, the estimation circuit 125 may select temperature compensation coefficients $c_m$ to $c_0$ with reference to a first table, may select additional temperature compensation coefficients $d_m$ to $d_0$ with reference to a second table, and may set coefficients $c_m d_m$ to $c_0 d_0$, which are obtained by multiplying the temperature compensation coefficients $c_m$ to $c_0$ and the additional temperature compensation coefficients $d_m$ to $d_0$, respectively, as the temperature compensation coefficients $b_m$ to $b_0$. The first table defines a correspondence relationship between amounts of change in the temperature control code DOVC and change in the temperature code DTS1 in the initial period and the temperature compensation coefficients $c_m$ to $c_0$. Further, the second table defines a correspondence relationship between a cumulative value of the temperature code DTS1 in the initial period and the additional temperature compensation coefficients $d_m$ to $d_0$. The first table and the second table are included in the temperature compensation data 92, and are decided as appropriate based on the simulation result and the evaluation result.

FIG. 17 is an example of the first table. In the example of FIG. 17, three temperature compensation coefficients are defined as the temperature compensation coefficients $c_m$ to $c_0$ for a combination of three ranges in which the amount of change in the temperature control code DOVC in the initial period is small, medium, and large and three ranges in which the amount of change in the temperature code DTS1 in the initial period is small, medium, and large.

FIG. 18 is an example of the second table. In the example of FIG. 18, three additional temperature compensation coefficients are defined as the additional temperature compensation coefficients $d_m$ to $d_0$ for three ranges in which the cumulative value of the temperature code DTS1 in the initial period is small, medium, and large.

For example, when the amount of change in the temperature control code DOVC in the initial period is in the small range and the amount of change in the temperature code DTS1 in the initial period is in the medium range, the estimation circuit 125 selects a temperature compensation coefficient 1 as the temperature compensation coefficients $c_m$ to $c_0$ with reference to the first table shown in FIG. 17. Further, when the cumulative value of the temperature code DTS1 in the initial period is in the large range, the estimation circuit 125 selects an additional temperature compensation coefficient 3 as the additional temperature compensation coefficients $d_m$ to $d_0$ with reference to the second table shown in FIG. 18. The estimation circuit 125 sets, as the temperature compensation coefficients $b_m$ to $b_0$, a coefficient obtained by multiplying the temperature compensation coefficient 1, which is selected as the temperature compensation coefficients $c_m$ to $c_0$, and the additional temperature compensation coefficient 3, which is selected as the additional temperature compensation coefficients $d_m$ to $d_0$.

As described above, in the initial period in which the temperature control element 71 starts to operate, the estimation circuit 125 estimates the temperature compensation coefficients $b_m$ to $b_0$, based on the temperature control code DOVC, which is the control signal for controlling the operation of the temperature control element 71, and the temperature measured by the temperature sensor 82.

The subtractor 124 subtracts the temperature code DTS3 from the temperature code DTS1 and outputs a temperature code DTSX. As described above, the temperature code DTS1 is a digital code corresponding to the voltage of the temperature measurement signal TS1 output from the oscillation IC 8. Further, the temperature code DTS3 is a digital code corresponding to the voltage of the temperature measurement signal TS3 output from the temperature sensor 42.

The second temperature compensation calculation circuit 127 calculates a second temperature compensation code DCMP2 for performing the second temperature compensation on the frequency of the oscillation signal OSCO based on the temperature code DTSX output from the subtractor 124. The second temperature compensation calculation circuit 127 may calculate the second temperature compensation code DCMP2 by a polynomial equation shown in Equation (3), in which the temperature code DTSX output from the subtractor 124 is set as a variable. Specifically, the second temperature compensation calculation circuit 127 substitutes the temperature code DTSX into Equation (3) to calculate the second temperature compensation code DCMP 2. Coefficients $a_n$ to $a_0$ in Equation (3) are included in the temperature compensation data 92. n is an integer of two or more, and is preferably three or more in order to perform the temperature compensation on the frequency of the oscillation signal OSCO with high accuracy.

$$DCMP2 = a_n \cdot DTSX^n + a_{n-1} \cdot DTSX^{n-1} + \ldots + a_1 \cdot DTSX + a_0 \quad (3)$$

As described above, the second temperature compensation calculation circuit 127 calculates the second temperature compensation code DCMP 2 as the second temperature compensation value for performing the temperature compensation on the frequency of the oscillation signal OSCO, based on the difference between the temperature measured by the temperature sensor 82 and the temperature measured by the temperature sensor 42.

The division ratio calculation circuit 128 calculates the division ratio of the fractional N-PLL circuit 45 based on the first temperature compensation code DCMP1 calculated by the first temperature compensation calculation circuit 126 and the second temperature compensation code DCMP2 calculated by the second temperature compensation calculation circuit 127. Specifically, the division ratio calculation circuit 128 calculates the division ratio of the fractional N-PLL circuit 45 based on the first temperature compensation code DCMP1 and the second temperature compensation code DCMP2 and performs the delta sigma modulation on the division ratio to generate the division ratio control signal DIVC. For example, the division ratio calculation circuit 128 may calculate the division ratio based on a temperature compensation code obtained by weighting and adding the first temperature compensation code DCMP1 and the second temperature compensation code DCMP 2. The fractional N-PLL circuit 45 performs the temperature compensation on the frequency of the oscillation signal OSCO, and thus the clock signal CK1 having high frequency accuracy is obtained.

The temperature of the resonator element 6 is stabilized, and then the frequency of the oscillation signal OSCO is controlled to be constant at the target frequency based on the second temperature compensation code DCMP 2 calculated by the second temperature compensation calculation circuit 127. Therefore, the first temperature compensation calculation circuit 126 may stop operating after the end of the start period after the temperature control element 71 starts to operate. For example, the temperature control circuit 11 may determine that the start period is ended when the difference between the set temperature code DTSET and the temperature code DTS1 is equal to or less than a predetermined value, and stop the operation of the first temperature compensation calculation circuit 126.

When the first temperature compensation calculation circuit 126 stops operating, after the end of the start period, the first temperature compensation code DCMP1 at the end of the start period is held, and the division ratio calculation circuit 128 generates the division ratio control signal DIVC based on the held first temperature compensation code DCMP1 and the second temperature compensation code DCMP2 calculated by the second temperature compensation calculation circuit 127. With the stop of the operation of the first temperature compensation calculation circuit 126 after the end of the start period, the power consumption of the digital signal processing circuit 10 is reduced. However, the first temperature compensation calculation circuit 126 may continue to operate even after the end of the start period.

As described above, the temperature compensation circuit 12 performs the first temperature compensation for performing the temperature compensation on the frequency of the oscillation signal OSCO, using the temperature compensation coefficients $b_m$ to $b_0$ estimated based on the control signal for controlling the operation of the temperature control element 71 and the measured temperature measured by the temperature sensor 82, and performs the second temperature compensation for performing the temperature compensation on the frequency of the oscillation signal OSCO, based on the difference between the measured temperature measured by the temperature sensor 82 and the measured temperature measured by the temperature sensor 42.

Figure 19:
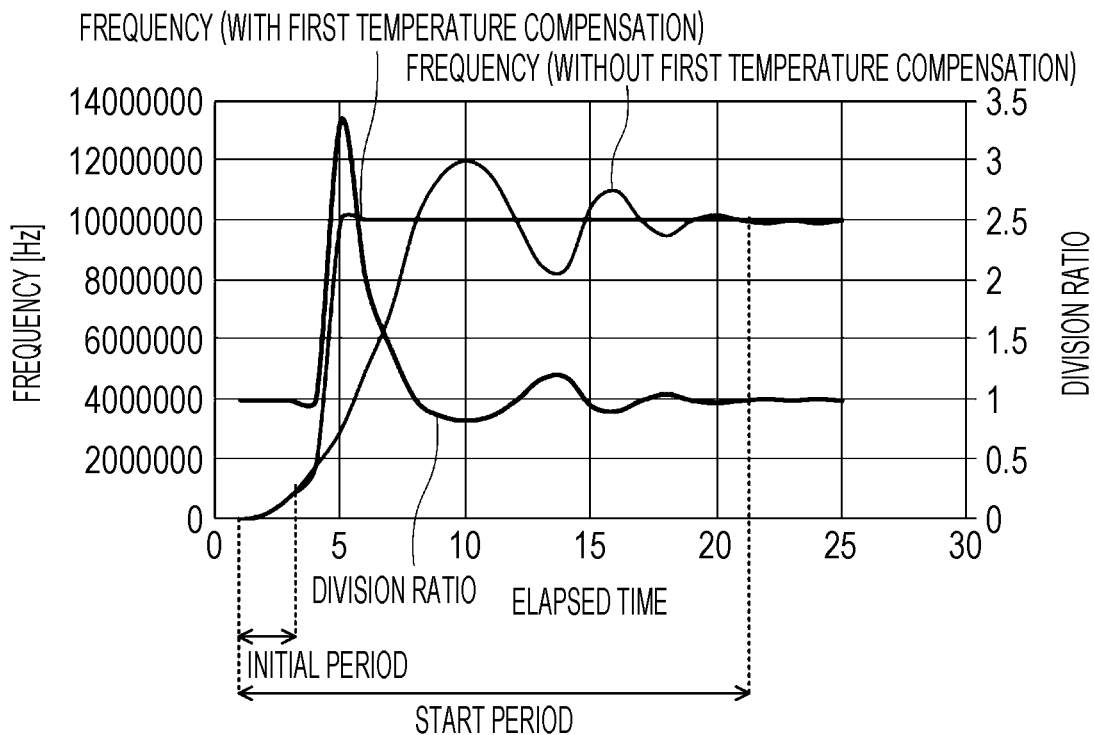
FIG. 19 is a graph showing an example of time changes in a frequency of an oscillation signal and a division ratio of a fractional N-PLL circuit in a start period.
Figure 20:
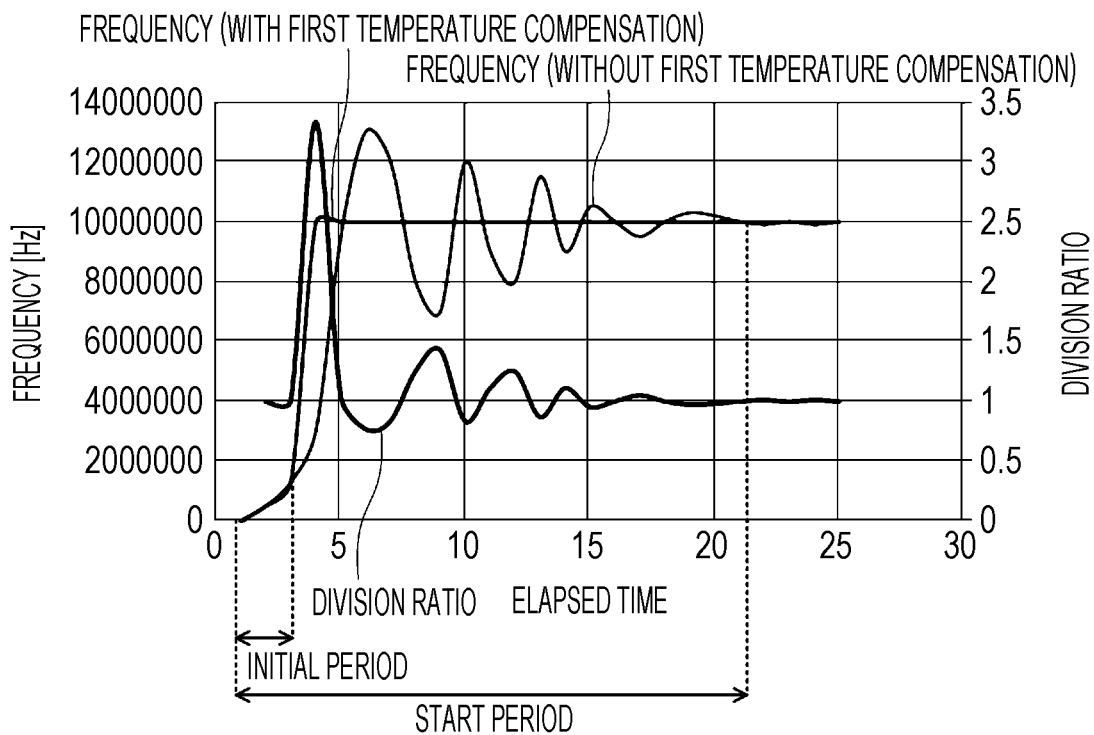
FIG. 20 is a graph showing another example of the time changes in the frequency of the oscillation signal and the division ratio of the fractional N-PLL circuit in the start period.

FIGS. 19 and 20 show examples of time changes in the frequency of the oscillation signal OSCO and the division ratio of the fractional N-PLL circuit 45 in the start period. In the example in FIG. 20, the outside air temperature at the time of start is higher, and the temperature of the resonator element 6 changes faster, as compared with FIG. 19. FIGS. 19 and 20 also show time changes in the frequency of the oscillation signal OSCO when the first temperature compensation is not performed for comparison. In both of FIGS. 19 and 20, a time until the frequency of the oscillation signal OSCO is stabilized is lengthened when the first temperature compensation is not performed. However, with the first temperature compensation, it can be seen that the time until the frequency of the oscillation signal OSCO is stabilized is significantly shortened.

In the example of FIG. 16, the temperature code DTS1 is input to the subtractor 124, assuming that the temperature of the oscillation IC 8 is closer to the temperature of the resonator element 6 than the temperature of the heat generation IC 7. However, when the temperature of the heat generation IC 7 is closer to the temperature of the resonator element 6 than the temperature of the oscillation IC 8, the temperature code DTS2 corresponding to a voltage of the temperature measurement signal TS2 output from the heat generation IC 7 may be input to the subtractor 124.

In the fourth embodiment, the temperature sensor 82 is an example of "first temperature sensor", and the temperature measured by the temperature sensor 82 is an example of "first measured temperature". Alternatively, the temperature sensor 72 is another example of "first temperature sensor", and the temperature measured by the temperature sensor 72 is another example of "first measured temperature". Further, the temperature sensor 42 is an example of "second temperature sensor", and the temperature measured by the temperature sensor 42 is an example of "second measured temperature". Further, the fractional N-PLL circuit 45 is an example of "PLL circuit".

As described above, in the oscillator 1 according to the fourth embodiment, the estimation circuit 125 can estimate the appropriate temperature compensation coefficients $b_m$ to $b_0$ according to the temperature of the resonator element 6 after the transition to the normal state, based on the control amount of the temperature control element 71 and the temperature of the resonator element 6 in the initial period in which the temperature control element 71 starts to operate. Therefore, with the oscillator 1 according to the fourth embodiment, since the first temperature compensation calculation circuit 126 can perform the appropriate first temperature compensation before the transition to the normal state, the time until the frequency of the oscillation signal OSCO is stabilized at the target frequency can be shortened.

Further, with the oscillator 1 according to the fourth embodiment, with the stop of the operation of the first temperature compensation calculation circuit 126 after the end of the start period, the power consumption of the digital signal processing circuit 10 after the transition to the normal state can be reduced.

With the oscillator 1 according to the fourth embodiment, since the temperature sensor 42 can capture the change in the outside air temperature, the second temperature compensation calculation circuit 127 can perform the appropriate second temperature compensation in consideration of the temperature change in the resonator element 6 due to the change in the outside air temperature. As a result, the frequency of the oscillation signal OSCO is kept constant at the target frequency regardless of the change in the outside air temperature.

5. Modification Examples

The present disclosure is not limited to the present embodiment, and various modifications can be made within the scope of the spirit of the present disclosure.

Although the temperature control element 71 and the temperature sensor 72 are built in the heat generation IC 7 in the above embodiment, the temperature control element 71 may be provided separately from the temperature sensor 72. Further, although the temperature sensor 82 is built in the oscillation IC 8 in the above embodiment, the temperature sensor 82 may be provided separately from the oscillation IC 8. Further, although the temperature sensor 42 is built in the control IC 4 in the above embodiment, the temperature sensor 42 may be provided separately from the control IC 4. In these cases, for example, the temperature sensors 72, 82, and 42 may be thermistors or platinum resistors.

Further, the control IC 4 includes one temperature sensor 42 in the above embodiment, but may include a plurality of temperature sensors. In this case, for example, the A/D converter 43 may convert a plurality of temperature measurement signals output from the plurality of temperature sensors into a plurality of temperature codes, and the digital signal processing circuit 10 may perform the temperature control or the temperature compensation based on the plurality of temperature codes. For example, the digital signal processing circuit 10 may perform the temperature control or the temperature compensation using an average value of the plurality of temperature codes as the temperature code DTS3.

Further, in the above embodiment, the temperature compensation is performed by controlling the division ratio of the fractional N-PLL circuit 45 based on the division ratio control signal DIVC output by the digital signal processing circuit 10. However, the temperature compensation method is not limited thereto. For example, the oscillation circuit 81 built in the oscillation IC 8 may have a capacitance array, and a capacitance value of the capacitance array may be selected based on the temperature compensation code DCMP calculated by the digital signal processing circuit 10 to perform the temperature compensation. Further, for example, the oscillation circuit 81 may have a variable capacitive element for frequency adjustment, a D/A converter may convert the temperature compensation code DCMP calculated by the digital signal processing circuit 10 into an analog signal, and a capacitance value of the variable capacitive element may be controlled based on the analog signal to perform the temperature compensation.

Further, in the above embodiment, one A/D converter 43 converts the temperature measurement signals TS1, TS2, and TS3 respectively into the temperature codes DTS1, DTS2, and DTS3 in a time-division manner. However, for example, the control IC 4 may include a plurality of A/D converters, and the plurality of A/D converters may convert the temperature measurement signals TS1, TS2, and TS3 respectively into the temperature codes DTS1, DTS2, and DTS3.

Further, in the above embodiment, the temperature control element 71 is the heat generation element such as a CMOS transistor. However, the temperature control element 71 may be an element configured to control the temperature of the resonator element 6, and may be a heat absorbing element such as a Peltier element depending on a relationship between the target set temperature of the resonator element 6 and the outside air temperature.

The above-described embodiments and modification examples are merely examples, and the present disclosure is not limited thereto. For example, each embodiment and each modification example can be combined as appropriate.

The present disclosure includes a configuration substantially the same as the configuration described in the embodiment, for example, a configuration having the same function, method, and result, or a configuration having the same purpose and effect. The present disclosure also includes a configuration in which a non-essential part of the configuration described in the embodiment is replaced. Further, the present disclosure includes a configuration that exhibits the same effects as the configuration described in the embodiment or a configuration that can achieve the same object. Further, the present disclosure includes a configuration in which a known technique is added to the configuration described in the embodiment.

The following contents are derived from the above-described embodiment and modification example.

According to an aspect of the present disclosure, there is provided an oscillator including
- a resonator element,
- a first temperature sensor that measures a temperature of the resonator element,
- a temperature control element that controls the temperature of the resonator element, and
- a temperature control circuit that generates a control signal for controlling an operation of the temperature control element, in which
- the temperature control circuit generates the control signal based on a value obtained by multiplying a difference between a set temperature and a first measured temperature measured by the first temperature sensor by a gain, and
- the gain is variable.

With the oscillator, since the gain for controlling the operation of the temperature control element that controls the temperature of the resonator element is variable, with the setting of appropriate gains according to various situations such as the application or the operation environment, the temperature of the resonator element can be appropriately controlled.

According to an aspect of the present disclosure, in the oscillator,
- the temperature control circuit may switch,
- when the difference between the set temperature and the first measured temperature is equal to or less than a first temperature difference, the gain from a first value to a second value smaller than the first value in a start period after the temperature control element starts to operate.

In the oscillator, the temperature of the resonator element is close to the target temperature in a short time by setting the gain to the first value at an initial stage of the start period, and the temperature of the resonator element converges to the target temperature in a short time by decreasing the gain to the second values when the temperature of the resonator element is close to the target temperature to some extent. Therefore, with the oscillator, the time until the temperature of the resonator element is stabilized at the target temperature can be shortened.

According to an aspect of the present disclosure, in the oscillator,
- the temperature control circuit may switch,
- when the difference between the set temperature and the first measured temperature is equal to or less than a second temperature difference smaller than the first temperature difference, the gain from the second value to a third value smaller than the second value in the start period.

In the oscillator, the temperature of the resonator element converges to the target temperature in a shorted time by decreasing the gain from the second value to the third value when the temperature of the resonator element is closer to the target temperature. Therefore, with the oscillator, the time until the temperature of the resonator element is stabilized at the target temperature can be further shortened.

According to an aspect of the present disclosure, in the oscillator,
- the temperature control circuit may switch,
- in a start period after the temperature control element starts to operate, power consumption by the temperature control element to a preset upper limit value or less.

With the oscillator, since the power consumption by the temperature control element is limited in the start period, stable operations of various systems using the oscillator can be ensured, and a degree of freedom in designing the systems is improved.

According to an aspect of the present disclosure, the oscillator further includes
- a temperature compensation circuit that performs temperature compensation on a frequency of an oscillation signal generated by causing the resonator element to oscillate, in which
- the temperature compensation circuit may include an estimation circuit that estimates a temperature compensation coefficient, based on the control signal and the first measured temperature, in an initial period in which the temperature control element starts to operate, and a first temperature compensation calculation circuit that calculates a first temperature compensation value for performing temperature compensation on a frequency of the oscillation signal based on the temperature compensation coefficient estimated by the estimation circuit and the first measured temperature.

In the oscillator, an appropriate temperature compensation coefficient according to the temperature of the resonator element after the transition to the normal state can be estimated based on a control amount of the temperature control element and the temperature of the resonator element in the initial period. Therefore, with the oscillator, since the first temperature compensation calculation circuit can perform the appropriate temperature compensation before the transition to the normal state, the time until the frequency of the oscillation signal is stabilized at the target frequency can be shortened.

According to an aspect of the present disclosure, the oscillator further includes a PLL circuit to which the oscillation signal is input, in which the temperature compensation circuit may further include a division ratio calculation circuit that calculates a division ratio of the PLL circuit based on the first temperature compensation value.

According to an aspect of the present disclosure, in the oscillator, the first temperature compensation calculation circuit may stop operating after an end of a start period after the temperature control element starts to operate.

With the oscillator, the power consumption after the start period is ended and the transition to the normal state is performed can be reduced.

According to an aspect of the present disclosure, the oscillator further includes a second temperature sensor, in which the temperature compensation circuit may include a second temperature compensation calculation circuit that calculates a second temperature compensation value for performing the temperature compensation on the frequency of the oscillation signal based on a difference between the first measured temperature and a second measured temperature measured by the second temperature sensor, and a distance between the resonator element and the second temperature sensor may be larger than a distance between the resonator element and the first temperature sensor.

With the oscillator, since the second temperature sensor can capture the change in the outside air temperature, the temperature compensation can be appropriately performed on the frequency of the oscillation signal in consideration of the temperature change in the resonator element due to the change in the outside air temperature. As a result, the frequency of the oscillation signal is kept constant at the target frequency regardless of the change in the outside air temperature.

What is claimed is:

1. An oscillator comprising:
a resonator element;
a first temperature sensor that measures a temperature of the resonator element;
a temperature control element that controls the temperature of the resonator element; and
a temperature control circuit that generates a control signal for controlling an operation of the temperature control element, wherein
the temperature control circuit generates the control signal based on a value obtained by multiplying a difference between a set temperature and a first measured temperature measured by the first temperature sensor by a gain,
the gain is variable, and
the temperature control circuit switches, when the difference between the set temperature and the first measured temperature is equal to or less than a first temperature difference, the gain from a first value to a second value smaller than the first value in a start period after the temperature control element starts to operate.

2. The oscillator according to claim 1, wherein
the temperature control circuit switches,
when the difference between the set temperature and the first measured temperature is equal to or less than a second temperature difference smaller than the first temperature difference, the gain from the second value to a third value smaller than the second value in the start period.

3. The oscillator according to claim 1, wherein
the temperature control circuit limits,
in a start period after the temperature control element starts to operate, power consumption by the temperature control element to a preset upper limit value or less.

4. An oscillator comprising:
a resonator element;
a first temperature sensor that measures a temperature of the resonator element;
a temperature control element that controls the temperature of the resonator element; and
a temperature control circuit that generates a control signal for controlling an operation of the temperature control element,
wherein the temperature control circuit generates the control signal based on a value obtained by multiplying a difference between a set temperature and a first measured temperature measured by the first temperature sensor by a gain, and
the gain is variable, and
the oscillator further includes:
a temperature compensation circuit that performs temperature compensation on a frequency of an oscillation signal generated by causing the resonator element to oscillate, wherein
the temperature compensation circuit includes
an estimation circuit that estimates a temperature compensation coefficient, based on the control signal and the first measured temperature, in an initial period in which the temperature control element starts to operate, and
a first temperature compensation calculation circuit that calculates a first temperature compensation value for performing temperature compensation on a frequency of the oscillation signal based on the temperature compensation coefficient estimated by the estimation circuit and the first measured temperature.

5. The oscillator according to claim 4, further comprising:
a PLL circuit to which the oscillation signal is input, wherein
the temperature compensation circuit further includes a division ratio calculation circuit that calculates a division ratio of the PLL circuit based on the first temperature compensation value.

6. The oscillator according to claim 4, wherein
the first temperature compensation calculation circuit stops operating after an end of a start period after the temperature control element starts to operate.

7. The oscillator according to claim 4, further comprising:
a second temperature sensor, wherein
the temperature compensation circuit further includes
- a second temperature compensation calculation circuit that calculates a second temperature compensation value for performing the temperature compensation on the frequency of the oscillation signal based on a difference between the first measured temperature and a second measured temperature measured by the second temperature sensor, and
- a distance between the resonator element and the second temperature sensor is larger than a distance between the resonator element and the first temperature sensor.

* * * * *